(12) United States Patent
Tanaka

(10) Patent No.: US 9,397,001 B2
(45) Date of Patent: Jul. 19, 2016

(54) METHOD FOR MANUFACTURING ELECTRONIC DEVICE COMPRISING A RESIN SUBSTRATE AND AN ELECTRONIC COMPONENT

(71) Applicant: Panasonic Intellectual Property Management Co., Ltd., Osaka (JP)

(72) Inventor: Yuji Tanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/945,501

(22) Filed: Nov. 19, 2015

(65) Prior Publication Data

US 2016/0172244 A1  Jun. 16, 2016

(30) Foreign Application Priority Data

Dec. 11, 2014  (JP) ................................. 2014-251273

(51) Int. Cl.
| | |
|---|---|
| *H01L 21/00* | (2006.01) |
| *H01L 21/78* | (2006.01) |
| *H01L 21/268* | (2006.01) |
| *H01L 27/12* | (2006.01) |

(52) U.S. Cl.
CPC .............. *H01L 21/78* (2013.01); *H01L 21/268* (2013.01); *H01L 27/1266* (2013.01)

(58) Field of Classification Search
None
See application file for complete search history.

(56) References Cited

U.S. PATENT DOCUMENTS

| | | | |
|---|---|---|---|
| 2003/0008437 A1* | 1/2003 | Inoue | H01L 21/6835 438/149 |
| 2004/0140547 A1* | 7/2004 | Yamazaki | H01L 21/6835 257/686 |
| 2004/0232413 A1* | 11/2004 | Yamazaki | H01L 27/1214 257/43 |
| 2005/0130391 A1* | 6/2005 | Takayama | H01L 21/2007 438/458 |
| 2008/0230682 A1* | 9/2008 | Yamazaki | H03F 3/08 250/214 A |
| 2010/0075447 A1 | 3/2010 | Lee et al. | |
| 2010/0323170 A1 | 12/2010 | Haskal | |
| 2011/0204361 A1* | 8/2011 | Nishiki | H01L 21/268 257/52 |
| 2014/0094079 A1 | 4/2014 | Ito et al. | |
| 2014/0246685 A1 | 9/2014 | Miura et al. | |

FOREIGN PATENT DOCUMENTS

| | | |
|---|---|---|
| JP | 10-239675 | 9/1998 |
| JP | 2010-516021 | 5/2010 |
| JP | 2014-071231 | 4/2014 |
| JP | 2014-170686 | 9/2014 |
| WO | 2008/050300 | 5/2008 |
| WO | 2009/037797 | 3/2009 |

* cited by examiner

*Primary Examiner* — Angel Roman
(74) *Attorney, Agent, or Firm* — Greenblum & Bernstein, P.L.C.

(57) ABSTRACT

An electronic component manufacturing method according to an aspect of the present disclosure includes providing a support substrate, forming a release layer including a metal or a metal oxide on a first surface of the support substrate, forming a resin substrate on the release layer, forming a functional element on the resin substrate, and separating the resin substrate from the support substrate by applying laser light to the support substrate through a second surface of the support substrate. The laser light that reaches an interface between the resin substrate and the release layer after being transmitted through the support substrate and the release layer has an energy density lower than a threshold for the resin substrate to be processed by the laser light.

17 Claims, 13 Drawing Sheets

LASER LIGHT L

FIG. 14

|  | INCREASE IN SHEET RESISTANCE (RELATIVE TO SHEET RESISTANCE BEFORE SEPARATION TAKEN AS 1) |
|---|---|
| EX.15 | 1.00 |
| COMP. EX.5 | 1.15 |

FIG. 15

|  | RELEASABILITY |
|---|---|
| EX.16 | SUCCESSFULLY RELEASED |
| COMP. EX.6 | NOT RELEASED |

METHOD FOR MANUFACTURING ELECTRONIC DEVICE COMPRISING A RESIN SUBSTRATE AND AN ELECTRONIC COMPONENT

BACKGROUND

1. Technical Field

The present disclosure relates to a method for manufacturing an electronic device comprising a resin substrate and an electronic component, and a method for manufacturing a flexible substrate comprising a resin substrate.

2. Description of the Related Art

Mobile information terminals have recently come into widespread use. There have been strong demands that electronic devices such as displays mounted on such portables as information terminals be thinned and be reduced in weight. In recent years, impact resistance and flexibility are additionally required.

Such needs have stimulated the development of flexible electronic devices in which functional elements of the electronic devices are disposed on flexible resin substrates in place of conventional glass substrates.

However, the flexure of a resin substrate exhibited during the formation of functional elements makes it difficult to ensure the flatness of the resin substrate. Due to this fact, difficulties are encountered in diverting the conventional manufacturing processes designed for glass substrates to this type of substrates.

To make a diversion of the conventional manufacturing processes designed for glass substrates, methods are proposed in which functional elements are formed on a resin substrate while using a hard support substrate such as a glass substrate.

For example, International Publication No. WO 2008/050300 discloses a method in which a resin substrate is formed on one surface of a support substrate, functional elements are formed on the resin substrate, and laser light is applied through the other surface of the support substrate in the final stage to separate the resin substrate carrying the functional elements from the support substrate.

Further, International Publication No. WO 2009/037797 discloses a method in which hydrogenated amorphous silicon as a release layer is formed on one surface of a support substrate, a resin substrate is formed on the release layer, functional elements are formed on the resin substrate, and laser light is applied through the other surface of the support substrate to separate the resin substrate carrying the functional elements from the support substrate. This method separates the resin substrate from the support substrate utilizing the pressure of hydrogen gas generated from the release layer (i.e. amorphous silicon) by the application of laser light.

SUMMARY

In one general aspect, the techniques disclosed here feature a method including: providing a support substrate having a first surface and a second surface opposite to the first surface; forming a release layer on the first surface of the support substrate, the release layer including a metal or a metal oxide; forming the resin substrate on the release layer; and separating the resin substrate from the support substrate by applying laser light to the support substrate through the second surface.

According to the present disclosure, deformation of a resin substrate can be reduced.

It should be noted that general or specific embodiments may be implemented as a device, a substrate, a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 14 is a view describing results of the measurement of the sheet resistance of MoW thin films after the release of resin substrates from stacked substrates of Example 15 and Comparative Example 5; and FIG. 15 is a view describing results of the evaluation of the releasability with respect to stacked substrates of Example 16 and Comparative Example 6.

Figure 1:
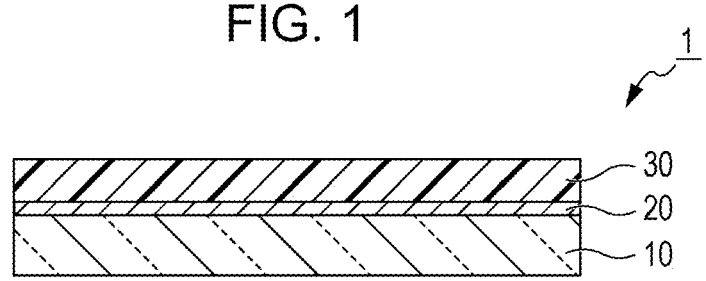
FIG. 1 is a sectional view illustrating a configuration of a stacked substrate according to an embodiment.

DETAILED DESCRIPTION (Underlying Knowledge Forming Basis of the Present Disclosure)

Hereinbelow, embodiments of aspects of the present disclosure will be described. Prior to the discussion, the underlying knowledge forming the basis of the aspects of the present disclosure will be described.

As mentioned above, a diversion of the conventional manufacturing processes designed for glass substrates has been made by a method in which functional elements are formed on a flexible resin substrate while using a hard support substrate such as a glass substrate.

For example, the method disclosed in International Publication No. WO 2008/050300 decreases the bond strength between the resin substrate and the support substrate by the application of laser light, thereby separating the resin substrate from the support substrate. Specifically, the bonding interface of the resin substrate with the support substrate is decomposed by laser light that has reached the resin substrate after transmitted through the support substrate. That is, the bonding interface of the resin substrate with the support substrate is decomposed by laser processing which heats the resin substrate or induces a photochemical reaction in the resin substrate. This processing decreases the bond strength of the resin substrate with respect to the support substrate and allows the resin substrate to be separated from the support substrate.

In the above method, however, the resin substrate is deformed by the pressure of a decomposition gas generated during the decomposition of the resin substrate by the laser light. The deformation of the resin substrate may cause damages to functional elements mounted on the resin substrate. In particular, ultrathin resin substrates that are thinned to about several micrometers in order to achieve high flexibility are significantly deformed by the pressure of a decomposition gas generated during the application of laser light. Therefore it is difficult to avoid damages to the functional elements. Further, in the above method, the resin substrate itself needs to absorb the laser light. Thus, the method cannot use resin substrates transparent to the laser light (for example, transparent resins).

In the method disclosed in International Publication No. WO 2009/037797, hydrogenated amorphous silicon is formed as a release layer between a support substrate and a resin substrate. This method separates the resin substrate from the support substrate utilizing the pressure of hydrogen gas generated from the hydrogenated amorphous silicon as the release layer by the application of laser light.

However, the resin substrate is deformed by the pressure of the hydrogen gas generated. Thus, the method cannot eliminate the risk that functional elements on the resin substrate may be damaged. Further, the semiconductor characteristics of any oxide semiconductors used as materials of the functional elements may be changed by the influence of the hydrogen generated. Consequently, reliability may be decreased.

The present inventor focused attention on the energy density of laser light (or the illumination intensity of laser light) that reaches resin substrates. The present inventor has then developed a method which can suppress the decomposition of a resin substrate by laser light during the separation of the resin substrate from a support substrate with use of laser light.

The techniques of the present disclosure are completed based on the above knowledge. The present disclosure provides an electronic device manufacturing method and a flexible substrate manufacturing method by which a resin substrate may be separated from a support substrate without causing the resin substrate to be deformed. The present disclosure also provides a stacked substrate and an electronic device that have an undeformed resin substrate.

A method according to an aspect of the present disclosure is an electronic device manufacturing method for manufacturing an electronic device comprising a resin substrate and an electronic component. The method includes: providing a support substrate having a first surface and a second surface opposite to the first surface; forming a release layer on the first surface of the support substrate, the release layer including a metal or a metal oxide; forming the resin substrate on the release layer; forming the electronic component on the resin substrate; and separating the resin substrate from the support substrate by applying laser light to the support substrate through the second surface of the support substrate. The laser light does not reach an first interface between the resin substrate and the release layer, or the laser light is transmitted through the support substrate and the release layer to reach the first interface. In the case that the laser light reaches the first interface, the laser light at the first interface has an energy density lower than a threshold for the resin substrate to be processed by the laser light.

The threshold for the resin substrate to be processed by the laser light means the minimum energy density of the laser light that induces the decomposition of the resin substrate when the resin substrate is irradiated with the laser light. The electronic component may be a functional element, such as a light emitting device that emits light a thin film transistor or a sensor.

According to the above aspect, the laser light does not reach the resin substrate, or the laser light that reaches the resin substrate has an energy density that is less than the threshold for the resin substrate to be processed by the laser light. Thus, the resin substrate is prevented from being decomposed by the laser light not only when the laser light is not transmitted through the release layer but also when the laser light is transmitted through the release layer. In this manner, the resin substrate may be prevented from being deformed during the separation of the resin substrate from the support substrate.

In the electronic device manufacturing method, the transmittance of the release layer at a wavelength of the laser light may be 30% or less.

According to the above embodiment, when laser light having an energy density that does not damage the support substrate is applied, the energy density of the laser light that has been transmitted through the support substrate and the release layer falls below the threshold for the resin substrate to be processed by the laser light, for example. Due to the transmittance, the whole or a major proportion of the laser light is not allowed to be transmitted through the release layer, and is thus prevented from reaching the resin substrate. Because the support substrate and the resin substrate may be separated from each other without the resin substrate being decomposed by the laser light, the deformation of the resin substrate may be prevented.

In the electronic device manufacturing method, the release layer may include the metal, and the metal may include at least one selected from the group consisting of zinc, indium, molybdenum and tungsten.

According to the above embodiment, the support substrate and the resin substrate may be separated from each other effectively by the application of laser light.

In the electronic device manufacturing method, the release layer may include the metal oxide, and the metal oxide may include at least one selected from the group consisting of zinc oxide, indium zinc oxide, indium tin oxide, aluminum oxide, molybdenum oxide and tungsten oxide.

According to the above embodiment, the support substrate and the resin substrate may be separated from each other effectively by the application of laser light.

In the electronic device manufacturing method, the metal oxide may be an oxygen-deficient metal oxide.

Oxygen-deficient metal oxides are more prone to be denatured by the application of laser light than metal oxides without oxygen deficiency. For example, the release layer including an oxygen-deficient metal oxide changes its crystallinity significantly or is broken upon irradiation with laser light. Thus, the use of an oxygen-deficient metal oxide as the release layer according to the above embodiment makes it possible to separate the support substrate and the resin substrate from each other with laser light having a lower energy density.

In the electronic device manufacturing method, the wavelength of the laser light may be not less than 250 nm and not more than 11000 nm.

According to the above embodiment, the resin substrate may be separated from the support substrate using laser light having a desired wavelength within the range between 250 nm and 11000 nm, so that the laser light can be transmitted through the support substrate.

In the electronic device manufacturing method, the resin substrate may contain fluorine element. In this case, a substance having a metal-fluorine bond is desirably formed at the interface between the resin substrate and the release layer by the application of the laser light.

According to the above embodiment, the fluorine element is released from the resin substrate during the application of laser light and is bonded to the metal element present in the release layer to form bonds between the metal and the fluorine (metal-fluorine bonds). The resultant metal fluoride layer formed between the release layer and the resin substrate is fragile and provides a release effect. As a result, the support substrate and the resin substrate may be separated from each other with laser light having a lower energy density than when the resin substrate does not contain the fluorine element.

In the electronic device manufacturing method, the resin substrate may include a transparent resin.

According to the above embodiment, even a transparent resin substrate transmissive to laser light may be used by virtue of the release layer that absorbs the laser light. It is therefore possible to separate the support substrate and the transparent resin substrate without causing damages to the electronic component on the transparent resin substrate by the action of the laser light. Thus, for example, the above configuration facilitates the manufacturing of bottom-emission displays in which light is extracted from the resin substrate side, and see-through transparent displays.

In the electronic device manufacturing method, the thickness of the release layer may be not more than 1000 nm.

According to the above embodiment, the release layer may change its state (i.e. the release layer is crystallized or broken.) when irradiated with the laser light, and consequently the resin substrate and the support substrate may be separated from each other effectively.

In the electronic device manufacturing method, the thickness of the resin substrate may be not less than 0.1 μm and not more than 100 μm.

According to the above embodiment, even a thin resin substrate may be used without being processed by the laser light transmitted through the release layer. That is, the resin substrate is not decomposed and no decomposition gas is generated. It is therefore possible to prevent the resin substrate from being deformed during the separation of the support substrate and the resin substrate. Thus, the above configuration allows for the production of, for example, very thin and highly flexible displays and stretchable displays.

A method according to another aspect of the present disclosure is an electronic device manufacturing method for manufacturing an electronic device comprising a resin substrate and an electronic component. The method includes: providing a support substrate having a first surface and a second surface opposite to the first surface; forming a release layer on a first surface of the support substrate, the release layer including a metal oxide including at least one selected from the group consisting of zinc oxide, indium zinc oxide, indium tin oxide, aluminum oxide, molybdenum oxide and tungsten oxide; forming the resin substrate on the release layer, the resin substrate containing fluorine element; forming the electronic component on the resin substrate; and separating the resin substrate from the support substrate by applying laser light to the support substrate through the second surface of the support substrate.

According to the above aspect, the fluorine element is released from the resin substrate during the application of the laser light and is bonded to the metal element present in the release layer comprising the metal oxide to form metal-fluorine bonds. The resultant metal fluoride layer formed between the release layer and the resin substrate is fragile and provides a release effect. As a result, the support substrate and the resin substrate may be separated from each other with laser light having a lower energy density than when the resin substrate does not contain the fluorine element. The electronic component may be a functional element, such as a light emitting device that emits light, a thin film transistor or a sensor.

A method according to still another aspect of the present disclosure is a flexible substrate manufacturing method for manufacturing a flexible substrate comprising a resin substrate. The method includes: providing a support substrate; forming a release layer including a metal or a metal oxide on a first surface of the support substrate; forming the resin substrate on the release layer; and separating the resin substrate from the support substrate by applying laser light to the support substrate through a second surface of the support substrate. The laser light does not reach an first interface between the resin substrate and the release layer, or the laser light is transmitted through the support substrate and the release layer to reach the first interface, and at the first interface, the laser light has an energy density lower than a threshold for the resin substrate to be processed by the laser light.

According to the above aspect, the resin substrate is not decomposed by the laser light even in the case where the laser light is transmitted through the release layer. Thus, the resin substrate may be separated from the support substrate without being deformed. It is therefore possible to manufacture flexible substrates while suppressing the occurrence of deformation.

Another aspect of the present disclosure resides in a stacked substrate including: a support substrate having a first surface and a second surface opposite to the first surface; a release layer including a metal or a metal oxide and disposed on the first surface of the support substrate, and a resin substrate disposed on the release layer. The resin substrate is separable from the support substrate by the application of laser light through the second surface of the support substrate in such a manner that the laser light does not reach an first interface between the resin substrate and the release layer, or the laser light is transmitted through the support substrate and the release layer to reach the first interface, and at the first interface, the laser light has an energy density lower than a threshold for the resin substrate to be processed by the laser light.

In the above aspect, the resin substrate may be separated from the support substrate by the application of laser light while ensuring that the resin substrate is not decomposed by the laser light, and consequently the resin substrate may be prevented from being deformed. Thus, stacked substrates resistant to damages by laser light may be realized.

In the stacked substrate, the transmittance of the release layer at a wavelength of the laser light may be 30% or less.

According to the above embodiment, when laser light having an energy density that does not damage the support substrate is applied, the energy density of the laser light that has been transmitted through the support substrate and the release layer falls below the threshold for the resin substrate to be processed by the laser light, for example. Due to the transmittance, the whole or a major proportion of the laser light is not allowed to be transmitted through the release layer, and is thus prevented from reaching the resin substrate. Because the support substrate and the resin substrate may be separated from each other without the resin substrate being decomposed, the deformation of the resin substrate may be prevented.

In the stacked substrate, the release layer may include the metal, and the metal may include at least one selected from the group consisting of zinc, indium, molybdenum and tungsten.

According to the above embodiment, the support substrate and the resin substrate may be separated from each other effectively by the application of laser light.

In the stacked substrate, the release layer may include the metal oxide, and the metal oxide may include at least one selected from the group consisting of zinc oxide, indium zinc oxide, indium tin oxide, aluminum oxide, molybdenum oxide and tungsten oxide.

According to the above embodiment, the support substrate and the resin substrate may be separated from each other effectively by the application of laser light.

In the stacked substrate, the metal oxide may be an oxygen-deficient metal oxide.

Oxygen-deficient metal oxides are more prone to be denatured by the application of laser light than metal oxides without oxygen deficiency. Thus, the use of an oxygen-deficient metal oxide as the release layer according to the above embodiment makes it possible to separate the support substrate and the resin substrate from each other with laser light having a lower energy density.

In the stacked substrate, the resin substrate may contain fluorine element.

According to the above embodiment, the fluorine element is released from the resin substrate during the application of laser light and is bonded to the metal element present in the release layer to form metal-fluorine bonds. The resultant metal fluoride layer formed between the release layer and the resin substrate is fragile and provides a release effect. As a result, the support substrate and the resin substrate may be separated from each other with laser light having a lower energy density than when the resin substrate does not contain the fluorine element.

In the stacked substrate, the resin substrate may include a transparent resin.

According to the above embodiment, even a transparent resin substrate transmissive to laser light may be used by virtue of the release layer that absorbs the laser light. It is therefore possible to separate the support substrate and the transparent resin substrate without causing damages to an electronic component (e.g. a functional element) mounted on the transparent resin substrate by the action of the laser light. Thus, for example, the above configuration allows for the manufacturing of bottom-emission displays in which light is extracted from the resin substrate side, and see-through transparent displays.

In the stacked substrate, the thickness of the release layer may be not more than 1000 nm.

According to the above embodiment, the release layer may change its state when irradiated with the laser light, and consequently the resin substrate and the support substrate may be separated from each other effectively.

In the stacked substrate, the thickness of the resin substrate may be not less than 0.1 μm and not more than 100 μm.

According to the above embodiment, even a thin resin substrate may be used without being processed by the laser light transmitted through the release layer. That is, the resin substrate is not decomposed and no decomposition gas is generated. It is therefore possible to prevent the resin substrate from being deformed during the separation of the support substrate and the resin substrate. Thus, the above configuration allows for the production of, for example, very thin and highly flexible displays and stretchable displays.

An electronic device according to another aspect of the present disclosure includes a resin substrate containing fluorine element and having first and second surfaces; and an electronic component disposed on the first surface of the resin substrate. On the second surface of the resin substrate, there exists a substance having a bond between fluorine and a metal including at least one selected from the group consisting of zinc, indium zinc, indium tin, aluminum, molybdenum and tungsten. The electronic component may be a functional element, such as a light emitting device that emits light, a thin film transistor or a sensor.

In the above aspect, a superficial layer of the substance may be formed on the second surface of the resin substrate during a process to separate the resin substrate from a support substrate by application of laser light. During the application of laser light, the fluorine element from the resin substrate is bonded to a metal element from a release layer between the resin substrate and the support substrate, so that the metal-fluorine bond is formed. The presence of such a superficial layer allows for the separation of the support substrate and the resin substrate with laser light having a lower energy density than when the resin substrate does not contain the fluorine element. Thus, the electronic device realized according to the above aspect has little damages caused by laser light.

EMBODIMENTS

Embodiments of the present disclosure will be described hereinbelow with reference to the drawings. The embodiments discussed below illustrate some specific examples of the present disclosure. The features described in the embodiments such as values, shapes, materials, constituent elements, the positions and the manners in which the constituent elements are arranged and connected, steps, and the order of the steps, are only illustrative and do not limit the scope of the present disclosure. Of the constituent elements described in the embodiments, those constituent elements which are not described in the independent claims representing the broadest concepts of the present disclosure are illustrated as optional constituent elements.

Further, the drawings are schematic and are not necessarily to scale. Substantially equivalent members will be indicated with the same reference signs in the drawings, and overlaps of the description of such members will be avoided by omission or simplification.

[Configuration of Stacked Substrates]

First, a stacked substrate 1 according to an embodiment will be described with reference to FIG. 1. FIG. 1 is a sectional view illustrating a configuration of the stacked substrate 1 according to the present embodiment.

As illustrated in FIG. 1, the stacked substrate 1 includes a support substrate 10, a release layer 20 disposed on a first surface of the support substrate 10, and a resin substrate 30 disposed on the release layer 20. That is, the stacked substrate 1 is a stack of the support substrate 10, the release layer 20 and the resin substrate 30.

[Support Substrate]

The support substrate 10 is a plate substrate. The resin substrate 30 having flexibility is formed on the support substrate 10. Thus, the support substrate 10 desirably has high flatness and is formed of a deformation-resistant material.

In a release step in which the resin substrate 30 is released from the support substrate 10, laser light is to be transmitted through the support substrate 10 to reach the release layer 20. Thus, the support substrate 10 is desirably made of a material having an appropriate transmittance to the laser light.

Examples of the materials of the support substrate 10 include glass materials such as alkali-free glass, soda glass, nonfluorescent glass, phosphate glass, borate glass and quartz. Examples of the materials of the support substrate 10 further include light-transmissive resin materials such as acrylic resins, styrene resins, polycarbonate resins, epoxy resins, polyethylene resins, polyester resins and silicone resins, and light-transmissive ceramic materials such as alumina. As an example, the support substrate 10 is a transparent glass substrate in the form of a plate.

[Release Layer]

The release layer 20 is disposed between the support substrate 10 and the resin substrate 30. In the present embodiment, the release layer 20 is disposed on the support substrate 10.

The release layer 20 serves as a separation layer that allows the support substrate 10 and the resin substrate 30 to be separated from each other. By the use of the release layer 20, the resin substrate 30 may be released from the support substrate 10.

The release layer 20 is desirably composed of such a material that the release layer 20 itself or the interface between the release layer 20 and the resin substrate 30 is denatured by the application of laser light to allow the resin substrate 30 to be released from the support substrate 10. Here, the term "denatured" comprehends both physical state changes of the release layer 20 such as melting, crystallization, sublimation and breakage, and chemical state changes such as chemical reactions occurring at the interface between the release layer 20 and the resin substrate 30.

For example, the material of the release layer 20 is a material including a metal or a metal oxide. The metal desirably includes one or more selected from the group consisting of zinc, indium, molybdenum and tungsten. The metal oxide desirably includes one or more selected from the group consisting of zinc oxide, indium zinc oxide, indium tin oxide, aluminum oxide, molybdenum oxide and tungsten oxide.

More specifically, examples of the metals for constituting the release layer 20 include single metals such as zinc, indium, molybdenum, tungsten, aluminum, magnesium and copper, and alloys such as aluminum-copper, aluminum-manganese, aluminum-magnesium and molybdenum-tungsten.

Examples of the metal oxides for constituting the release layer 20 include zinc oxide, indium zinc oxide, indium tin oxide, aluminum oxide, molybdenum oxide, tungsten oxide, indium oxide, indium tin zinc oxide, magnesium oxide, copper oxide, lithium oxide, potassium oxide, sodium oxide and calcium oxide.

The transmittance of the release layer 20 at the wavelength of laser light used is desirably 30% or less. When the transmittance of the release layer 20 is equal to or less than 30%, the laser light transmitted through the release layer 20 will not process and decompose the resin substrate 30. Thus, the possibility of the generation of a decomposition gas is reduced. Consequently, the resin substrate 30 will not be deformed by the pressure of the decomposition gas.

The thickness of the release layer 20 is desirably not less than 1 nm and not more than 1000 nm. When the thickness of the release layer 20 is equal to or more than 1 nm, the laser light will not be substantially transmitted through the release layer 20 and will not decompose the resin substrate 30. Thus, the possibility of the deformation of the resin substrate 30 is reduced. When, on the other hand, the thickness of the release layer 20 is equal to or less than 1000 nm, the denaturation occurring from the side on which the laser light is incident will reach the interface between the release layer 20 and the resin substrate 30. Thus, the resin substrate 30 will be released from the support substrate 10.

When the release layer 20 includes a metal oxide, it is desirable that the release layer 20 be deficient of oxygen. Oxygen-deficient metal oxides are denatured by the application of laser light to a greater degree than oxygen-saturated metal oxides. Thus, the detachment of the resin substrate 30 from the support substrate 10 may be accomplished with laser light having a lower energy density.

[Resin Substrate]

The resin substrate 30 is disposed on the release layer 20. The resin substrate 30 is a flexible substrate having flexibility. For example, a functional element such as a light-emitting device is formed on of the resin substrate 30 that is opposite to the side on which the release from the support substrate 10 takes place. Thus, the observe surface is the surface without the release layer 20. By forming a functional element on the flexible resin substrate 30, a flexible electronic device may be obtained.

The kind of the resin material for constituting the resin substrate 30 is not particularly limited. Examples thereof include polyamides, polyimides, polyamidimides, polyesters, polycarbonates, polymethyl methacrylates, polyureas, polyether ketones, polyether ether ketones, polyether imides and polyallylates. A mixture of two or more kinds of these materials may be used. Further, these materials may be chemically modified. The resin substrate 30 may be a single layer structure or a multilayer structure combining two or more kinds of the above materials. As an example, the resin substrate 30 is a transparent resin substrate formed of a transparent resin, although not limited thereto.

In order to realize a flexible electronic device, the resin substrate 30 desirably shows a resistance to cracking or breakage when it is bent.

The thickness of the resin substrate 30 is desirably not less than 0.1 μm and not more than 100 μm. When the thickness of the resin substrate 30 is equal to or more than 0.1 μm, the resin substrate 30 has enough mechanical strength. If, on the other hand, the thickness of the resin substrate 30 is equal to or less than 100 μm, the resin substrate 30 is prone to bending and it is possible obtain a highly flexible electronic device.

The resin substrate 30 may contain fluorine element. In other words, the resin substrate 30 may contain fluorine atoms. The resin substrate 30 containing the fluorine element may include a resin material having a C—F bond (a carbon-fluorine bond) as part of a substituent group. That is, the resin material constituting the resin substrate 30 is represented by a structural formula including a C—F bond.

When the resin substrate 30 contains the fluorine element, the application of laser light to the support substrate 10 on which the metal-containing release layer 20 is disposed results in the formation of bonds between the metal element derived from the release layer 20 and fluorine (metal-fluorine bonds). The bonds are formed at the interface between the release layer 20 and the resin substrate 30, or the bonds are formed in a superficial layer of the resin substrate 30 that will come on the backside after the release of the resin substrate 30. Specifically, a metal fluoride layer having bonds between the metal and fluorine (metal-fluorine bonds) is formed. This layer is fragile and provides a release effect. As a result, the resin substrate may be separated from the support substrate with laser light having a lower energy density than when the resin substrate does not contain the fluorine element.

The resin substrate 30 is separable from the support substrate 10 by the application of laser light through the backside surface (i.e. the second surface) of the support substrate 10 in such a manner that the laser light that reaches the surface of the resin substrate 30 adjacent to the release layer 20 has an energy density lower than the threshold for the resin substrate 30 to be processed by the laser light.

Because the resin substrate 30 is not decomposed by the laser light applied to separate the resin substrate 30 from the support substrate 10, the deformation of the resin substrate 30 may be prevented. Here, as already mentioned hereinabove, the threshold for the resin substrate 30 to be processed by the laser light means the minimum energy density of the laser light that induces the decomposition of the resin substrate 30 when the resin substrate 30 is irradiated with the laser light.

[Method for Producing Stacked Substrate]

Figure 2A:
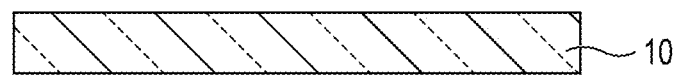
FIG. 2A is a sectional view illustrating a step in a method for producing a stacked substrate according to an embodiment.
Figure 2B:
FIG. 2B is a sectional view illustrating a step in the method for producing a stacked substrate according to an embodiment.
Figure 2C:
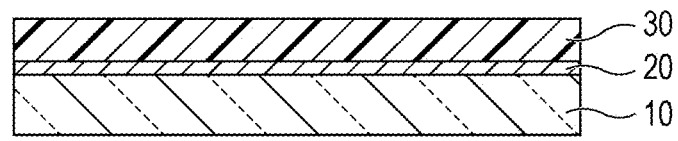
FIG. 2C is a sectional view illustrating a step in the method for producing a stacked substrate according to an embodiment.

Next, a method for producing the stacked substrate 1 according to the present embodiment will be described with reference to FIGS. 2A to 2C. FIGS. 2A to 2C are a set of sectional views illustrating steps in the method for producing the stacked substrate 1 according to the present embodiment.

First, as illustrated in FIG. 2A, the support substrate 10 is provided.

Next, as illustrated in FIG. 2B, the release layer 20 is formed on the first surface of the support substrate 10. Examples of the methods for forming the release layer 20 include resistance heating deposition, electron beam deposition, sputtering, CVD (chemical vapor deposition) and ALD (atomic layer deposition).

The release layer 20 may be formed while changing the compositional ratio of oxygen present in the release layer 20. When, for example, the release layer 20 is formed by sputtering, the compositional ratio of oxygen present in the release layer 20 may be changed by controlling the ratio of the flow rates of oxygen and argon. By changing the compositional ratio of oxygen, a metal oxide containing oxygen may be formed as the release layer 20. For example, an oxygen-deficient metal oxide may be formed.

Next, as illustrated in FIG. 2C, the resin substrate 30 is formed on the release layer 20. The resin substrate 30 may be formed by applying a liquid resin material as a precursor onto the release layer 20 and curing the precursor. Alternatively, the resin substrate 30 may be formed by laminating a film formed beforehand as the resin substrate 30 onto the release layer 20 disposed on the support substrate 10.

Examples of the methods for applying the liquid resin material include slit coating, spin coating, dip coating, roll coating, spray coating, blade coating, inkjet printing and screen printing. Examples of the methods for laminating the resin substrate 30 include bonding the resin substrate 30 in the form of a film onto the release layer 20 disposed on the support substrate 10 through an adhesive. Examples of the methods for laminating the resin substrate 30 also include attaching the resin substrate 30 to the release layer 20 disposed on the support substrate 10 by a technique other than the use of an adhesive, for example, by the application of pressure.

In the manner described above, the stacked substrate 1 in which the support substrate 10, the release layer 20 and the resin substrate 30 are stacked together may be produced.

[Configuration of Electronic Devices]

Figure 3A:
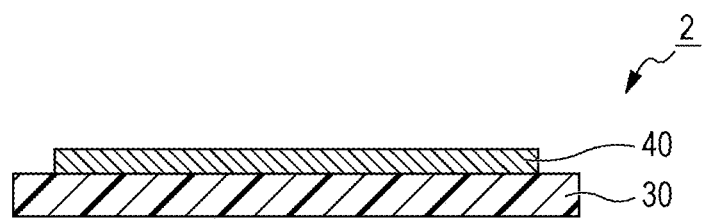
FIG. 3A is a sectional view illustrating a configuration of an electronic device according to an embodiment.
Figure 3B:
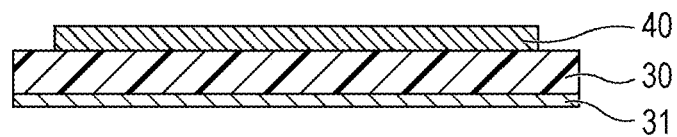
FIG. 3B is a sectional view illustrating a configuration of an electronic device according to a modified embodiment.

Next, embodiments of the configuration of an electronic device 2 will be described with reference to FIG. 3A and FIG. 3B. FIG. 3A is a sectional view illustrating a configuration of the electronic device 2 according to an embodiment. FIG. 3B is a sectional view illustrating a configuration of the electronic device 2 according to a modified embodiment.

As illustrated in FIG. 3A, the electronic device 2 is a flexible electronic device having flexibility, and includes a resin substrate 30 and a functional element 40 disposed on a first surface of the resin substrate 30. The functional element 40 is an electronic element. The first surface of the resin substrate 30 is an observe surface. The resin substrate 30 is the same as described hereinabove.

For example, the functional element 40 is a flexible functional element having flexibility. The functional element 40 is not particularly limited. Examples thereof include drive circuit elements composed of components such as oxide thin-film transistors (TFTs), amorphous silicon TFTs, polysilicon TFTs and organic TFTs, light-emitting devices such as organic EL devices and inorganic EL devices, sensors such as touch sensors and pressure sensors, photodiodes, and combinations of these elements.

In the present embodiment, the functional element 40 is disposed directly on the resin substrate 30. Alternatively, a sealing layer (not shown) as a barrier film that prevents the permeation of water and gas from the outside may be disposed between the resin substrate 30 and the functional element 40.

In this case, the sealing layer is desirably any of inorganic films made of inorganic materials such as silicon nitride films, silicon oxide films, silicon oxynitride films, aluminum oxide films, zirconium oxide films and stacks of these films, and alternate stacks including these inorganic films and resin films made of resin materials. The resin material used in the sealing layer may be the same as or different from the material of the resin substrate 30, and the resin material may contain a getter agent such as calcium oxide, porous zeolite or porous silica.

Although not shown, other layers may be disposed on the functional element 40 such as a sealing layer serving as a barrier film that prevents the permeation of water and gas from the outside, and a protective layer that prevents physical damages or ensures mechanical strength.

In this case, the sealing layer is desirably any of inorganic films made of inorganic materials such as silicon nitride films, silicon oxide films, silicon oxynitride films, aluminum oxide films, zirconium oxide films and stacks of these films, and alternate stacks including these inorganic films and resin films made of resin materials. The resin material used in the sealing layer may be the same as or different from the material of the resin substrate 30, and the resin material may contain a getter agent such as calcium oxide, porous zeolite or porous silica. The protective layer may be a film formed by the application of a resin material such as an epoxy resin, an acrylic resin or a silicone resin, or may be a resin film attached to the functional element 40 that is made of a resin such as a polyester, a polyolefin, a polycarbonate, a polyimide, a polyamide or a silicone. The protective layer may include an optional component such as a touch panel, a circular polarizer or a color filter as required.

As illustrated in FIG. 3B, the electronic device 2 may include a substance having bonds between a metal and fluorine (metal-fluorine bonds) in a superficial layer 31 on a second surface (i.e. a backside surface) of the resin substrate 30. In this case, the resin substrate 30 is a fluorine-containing resin substrate, and the metal-fluorine bonds in the superficial layer 31 are formed between the fluorine element from the resin substrate 30 and a metal. Specifically, the superficial layer 31 is a metal fluoride layer having metal-fluorine bonds that is fragile and provides a release effect. For example, the metal element (metal atoms) forming the metal-fluorine bonds includes at least one of zinc, indium zinc, indium tin, aluminum, molybdenum and tungsten, and is derived from a release layer 20 described later.

[Method for Manufacturing Electronic Device]

Next, a method for manufacturing the electronic device 2 according to the present embodiment will be described with reference to FIGS. 4A to 4F. FIGS. 4A to 4F are a set of sectional views illustrating steps in the method for manufacturing the electronic device 2 according to the present embodiment.

Figure 4A:
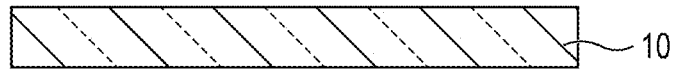
FIG. 4A is a sectional view illustrating a step in a method for manufacturing an electronic device according to an embodiment.
Figure 4B:
FIG. 4B is a sectional view illustrating a step in the method for manufacturing an electronic device according to an embodiment.
Figure 4C:
FIG. 4C is a sectional view illustrating a step in the method for manufacturing an electronic device according to an embodiment.

In the present embodiment, the electronic device 2 is manufactured using the stacked substrate 1 described hereinabove. That is, FIGS. 4A to 4C are the same as FIGS. 2A to 2C, and the method is the same as described hereinabove until the production of the stacked substrate 1. Specifically, the support substrate 10 is provided (FIG. 4A), the release layer 20 is formed on the first surface of the support substrate 10 (FIG. 4B), and the resin substrate 30 is formed on the release layer 20 (FIG. 4C).

Figure 4D:
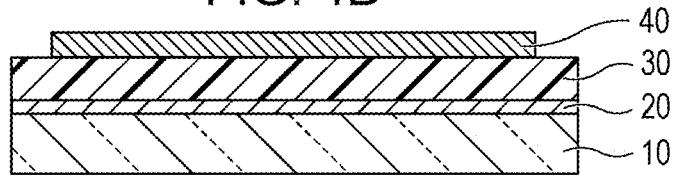
FIG. 4D is a sectional view illustrating a step in the method for manufacturing an electronic device according to an embodiment.

Next, as illustrated in FIG. 4D, the functional element 40 is formed on the resin substrate 30.

Figure 4E:
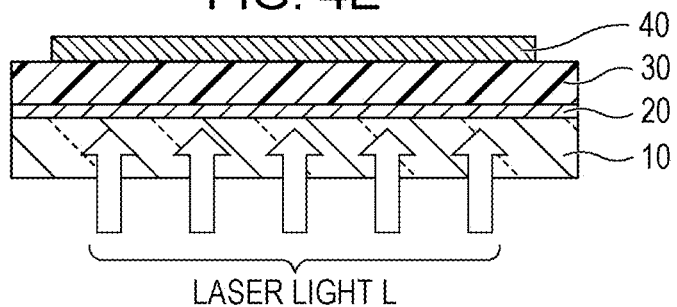
FIG. 4E is a sectional view illustrating a step in the method for manufacturing an electronic device according to an embodiment.
Figure 4F:
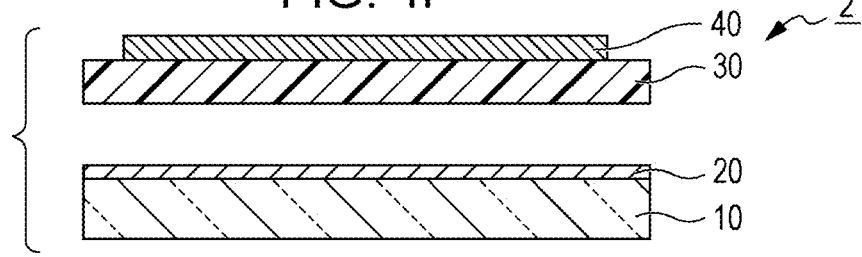
FIG. 4F is a sectional view illustrating a step in the method for manufacturing an electronic device according to an embodiment.

Next, as illustrated in FIG. 4E, laser light L is applied through the backside surface of the support substrate 10 (i.e. the surface opposite to the surface on which the release layer 20 is disposed), and thereby the resin substrate 30 is separated from the support substrate 10. Specifically, the application of the laser light L allows the resin substrate 30 to be detached from the release layer 20. As illustrated in FIG. 4F, the resin substrate 30 is released from the release layer 20 while carrying the functional element 40.

When the resin substrate 30 is separated from the support substrate 10 using the laser light, the energy density of the laser light that reaches the surface of the resin substrate 30 adjacent to the release layer 20 has been reduced to below the threshold for the resin substrate 30 to be processed by the laser light. In the present embodiment, the release layer 20 absorbs the laser light L that is applied, and the energy of the light is attenuated to a sufficiently low energy density by the time when the laser light L reaches the interface between the resin substrate 30 and the release layer 20.

Because the resin substrate 30 is not decomposed by the laser light L and thus no decomposition gas is generated, the resin substrate 30 may be separated from the support substrate 10 without any deformation of the resin substrate 30. Thus, the resin substrate 30 may be separated from the support substrate 10 while ensuring that the functional element 40 is not damaged.

In the manner described above, the electronic device 2 in which the functional element 40 is stacked on the resin substrate 30 may be manufactured.

While the present embodiment illustrates that the functional element 40 is formed on the resin substrate 30, the formation of the functional element 40 may be omitted. In this case, the resin substrate 30 may be produced by delaminating the stacked substrate 1 so as to separate the resin substrate 30 from the support substrate 10. That is, the method of the present embodiment may be used also for the production of the resin substrate 30 (i.e. flexible substrate).

In the present embodiment, it is desirable to use a resin substrate 30 containing fluorine element and a release layer 20 made of a metal or a metal oxide. During the application of laser light L, the fluorine element is released from the resin substrate 30 and is bonded to the metal element in the release layer 20 to form metal-fluorine bonds, resulting in the formation of a metal fluoride layer between the release layer 20 and the resin substrate 30. Alternatively, as illustrated in FIG. 3B, the bonding results in the formation of a superficial layer 31 on the second surface (i.e. the backside surface) of the resin substrate 30 which includes a substance having metal-fluorine bonds. The superficial layer 31 is a metal fluoride layer. This metal fluoride layer is fragile and provides a release effect. As a result, the resin substrate 30 may be separated from the support substrate 10 with laser light having a lower energy density than when a resin substrate that does not contain the fluorine element is used.

(Advantages and Effects)

Next, the effects obtained in the present embodiment will be described in comparison with Comparative Example. FIGS. 5A to 5E are a set of sectional views illustrating steps in a method for manufacturing an electronic device in Comparative Example.

In Comparative Example, a resin substrate 30 is formed directly on a support substrate 10 without forming a release layer 20 between the support substrate 10 and the resin substrate 30. The resin substrate 30 is separated from the support substrate 10 by the application of laser light.

Figure 5A:
FIG. 5A is a sectional view illustrating a step in a method for manufacturing an electronic device in Comparative Example.
Figure 5B:
FIG. 5B is a sectional view illustrating a step in the method for manufacturing an electronic device in Comparative Example.
Figure 5C:
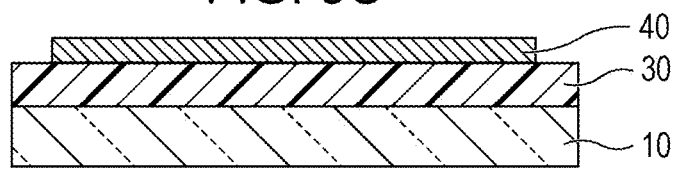
FIG. 5C is a sectional view illustrating a step in the method for manufacturing an electronic device in Comparative Example.
Figure 5D:
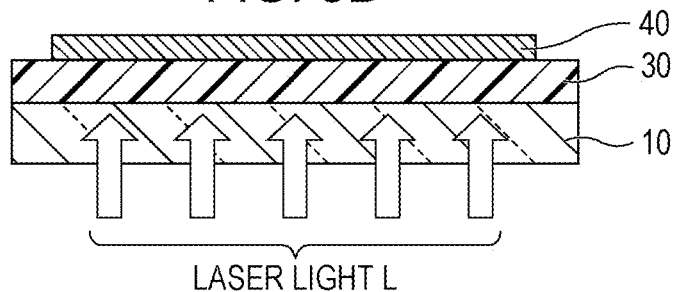
FIG. 5D is a sectional view illustrating a step in the method for manufacturing an electronic device in Comparative Example.

Specifically, the support substrate 10 is provided (FIG. 5A), the resin substrate 30 is formed on the support substrate 10 (FIG. 5B), a functional element 40 is formed on the resin substrate 30 (FIG. 5C), and laser light L is applied through the backside surface of the support substrate 10 (FIG. 5D). The laser light L that has been transmitted through the support substrate 10 decomposes the resin substrate 30 and thereby the resin substrate 30 is released from the support substrate 10.

Figure 5E:
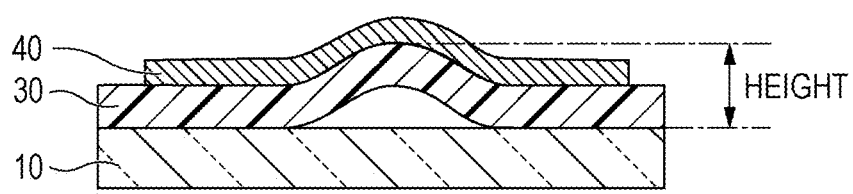
FIG. 5E is a sectional view illustrating a step in the method for manufacturing an electronic device in Comparative Example.

In this case, as illustrated in FIG. 5E, the resin substrate 30 is deformed by the pressure of a decomposition gas generated by the decomposition of the resin substrate 30. Specifically, the deformation of the resin substrate 30 is elongation and the elongation strain is expressed as $[(d+\Delta d)/d]^{-1}$ wherein d is the length before the laser light application and d+$\Delta$d is the length after the laser light application. When, for example, the resin substrate 30 is one that has a silicon nitride inorganic film generally used as a sealing film, the critical strain prior to the breakage of the sealing film is about 0.5 to 1.0%. Even such a small change causes a damage to a layer disposed on the substrate.

In contrast, the method for manufacturing the electronic device 2 according to the present embodiment illustrated in FIGS. 4A to 4F involves the release layer 20 disposed between the support substrate 10 and the resin substrate 30.

The material and the thickness of the release layer 20 are selected so that the release layer 20 will have a transmittance that decreases the energy density of the laser light transmitted therethrough to below the threshold for the resin substrate 30 to be processed by the laser light. In the present embodiment, the release layer 20 has such a characteristic that the release layer 20 itself or the interface between the release layer 20 and the resin substrate 30 is denatured by the application of laser light to allow the resin substrate 30 to be released from the support substrate 10.

Because the resin substrate 30 is not decomposed by the laser light, the resin substrate 30 is prevented from deformation caused by the pressure of a decomposition gas from the resin substrate 30. This ensures that the resin substrate 30 may be released from the support substrate 10 with the minimum amount of deformation.

As discussed above, the present embodiment makes it possible to separate the resin substrate 30 from the support substrate 10 without causing a deformation of the resin substrate. Thus, it is possible to prevent the functional element 40 from being damaged during the separation of the resin substrate 30 from the support substrate 10. Further, the resin substrate 30 may be separated from the support substrate 10 stably and easily.

EXAMPLES

Experiments were carried out to illustrate Examples of the present disclosure. The results of the experiments and the advantages such as benefits and effects of the present disclosure will be described below. Prior to conducting the experiments, stacked substrates were prepared in accordance with the procedures described in [Example 1] to [Example 16], [Comparative Example 1], [Comparative Example 5], [Comparative Example 6], and [Experimental Example 2] to [Experimental Example 4] below. In all the stacked substrates, the resin materials used to form resin substrates were polyimides (PI).

Example 1

IZO: 0% $O_2$

A glass substrate made of alkali-free glass (Eagle XG: registered trademark of Corning Incorporated) was provided as a support substrate 10. On the support substrate 10, a release layer 20 made of indium zinc oxide (InZnO) was formed. Specifically, an InZnO film as the release layer 20 was formed in a thickness of 200 nm by a DC magnetron sputtering method using indium zinc oxide as the target. During the sputtering, the atmosphere was maintained at 100% Ar (the ratio of oxygen gas: 0%). Next, the release layer 20 was spin coated with polyamide acid U-Varnish S (manufactured by UBE INDUSTRIES, LTD.). The wet film was imidized by being calcined at 400° C. in a nitrogen atmosphere to form a 20 μm thick polyimide film as a resin substrate 30. In the manner described above, a stacked substrate 1 of Example 1 was fabricated. The release layer 20 (i.e. the InZnO film) in Example 1 was deficient of oxygen.

Example 2

IZO: 4% $O_2$

In Example 2, a stacked substrate 1 was fabricated in the same manner as in Example 1, except that the atmosphere during the sputtering of the release layer 20 was composed of 96% Ar and 4% $O_2$ (the ratio of oxygen gas: 4%). The release layer 20 (the InZnO film) in Example 2 was not deficient of oxygen.

Example 3

IZO: 10% $O_2$

In Example 3, a stacked substrate 1 was fabricated in the same manner as in Example 1, except that the atmosphere during the sputtering of the release layer 20 was composed of 90% Ar and 10% O$_2$ (the ratio of oxygen gas: 10%). The release layer 20 (the InZnO film) in Example 3 was not deficient of oxygen.

Example 4

ZnO: 0% O$_2$

A glass substrate that was the same as the one used in Example 1 was provided as a support substrate 10. On the support substrate 10, a release layer 20 made of zinc oxide (ZnO) was formed. Specifically, a ZnO film as the release layer 20 was formed in a thickness of 200 nm by a DC magnetron sputtering method using zinc oxide as the target. During the sputtering, the atmosphere was maintained at 100% Ar (the ratio of oxygen gas: 0%). Next, the release layer 20 was spin coated with polyamide acid U-Varnish S (manufactured by UBE INDUSTRIES, LTD.). The wet film was imidized by being calcined at 400° C. in a nitrogen atmosphere to form a 20 μm thick polyimide film as a resin substrate 30. In the manner described above, a stacked substrate 1 of Example 4 was fabricated.

Example 5

ZnO: 17% O$_2$

In Example 5, a stacked substrate 1 was fabricated in the same manner as in Example 4, except that the atmosphere during the sputtering of the release layer 20 was composed of 83% Ar and 17% O$_2$ (the ratio of oxygen gas: 17%).

Example 6

ZnO: 33% O$_2$

In Example 6, a stacked substrate 1 was fabricated in the same manner as in Example 4, except that the atmosphere during the sputtering of the release layer 20 was composed of 67% Ar and 33% O$_2$ (the ratio of oxygen gas: 33%).

Example 7

AlO: 2% O$_2$

A glass substrate that was the same as the one used in Example 1 was provided as a support substrate 10. On the support substrate 10, a release layer 20 made of aluminum oxide (AlO) was formed. Specifically, an AlO film as the release layer 20 was formed in a thickness of 200 nm by a DC magnetron sputtering method using aluminum oxide as the target. During the sputtering, the atmosphere was maintained at 98% Ar and 2% O$_2$ (the ratio of oxygen gas: 2%). Next, the release layer 20 was spin coated with polyamide acid U-Varnish S (manufactured by UBE INDUSTRIES, LTD.). The wet film was imidized by being calcined at 400° C. in a nitrogen atmosphere to form a 20 μm thick polyimide film as a resin substrate 30. In the manner described above, a stacked substrate 1 of Example 7 was fabricated.

Example 8

AlO: 6% O$_2$

In Example 8, a stacked substrate 1 was fabricated in the same manner as in Example 7, except that the atmosphere during the sputtering of the release layer 20 was composed of 94% Ar and 6% O$_2$ (the ratio of oxygen gas: 6%).

Example 9

ITO: 0% O$_2$

A glass substrate that was the same as the one used in Example 1 was provided as a support substrate 10. On the support substrate 10, a release layer 20 made of indium tin oxide (ITO) was formed. Specifically, an ITO film as the release layer 20 was formed in a thickness of 200 nm by a DC magnetron sputtering method using indium tin oxide as the target. During the sputtering, the atmosphere was maintained at 100% Ar (the ratio of oxygen gas: 0%). Next, the release layer 20 was spin coated with polyamide acid U-Varnish S (manufactured by UBE INDUSTRIES, LTD.). The wet film was imidized by being calcined at 400° C. in a nitrogen atmosphere to form a 20 μm thick polyimide film as a resin substrate 30. In the manner described above, a stacked substrate 1 of Example 9 was fabricated.

Example 10

IZO: 4% O$_2$, 10 nm

In Example 10, a stacked substrate 1 was fabricated in the same manner as in Example 2, except that the thickness of the release layer 20 was changed to 10 nm.

Example 11

IZO: 4% O$_2$, 50 nm

In Example 11, a stacked substrate 1 was fabricated in the same manner as in Example 2, except that the thickness of the release layer 20 was changed to 50 nm.

Example 12

IZO: 4% O$_2$, 100 nm

In Example 12, a stacked substrate 1 was fabricated in the same manner as in Example 2, except that the thickness of the release layer 20 was changed to 100 nm.

Example 13

IZO: 4% O$_2$, 600 nm

In Example 13, a stacked substrate 1 was fabricated in the same manner as in Example 2, except that the thickness of the release layer 20 was changed to 600 nm.

Example 14

Fluorine-containing polyimide resin substrate: 20 nm+IZO: 100 nm

A glass substrate that was the same as the one used in Example 1 was provided as a support substrate 10. On the support substrate 10, a release layer 20 made of indium zinc oxide (InZnO) was formed. Specifically, an IZO film as the release layer was formed in a thickness of 200 nm by a DC magnetron sputtering method using indium zinc oxide as the target. During the sputtering, the atmosphere was maintained at 100% Ar. Next, the release layer 20 was spin coated with a DMAc (dimethylacetamide) solution of a polyamide acid represented by the following chemical formula (Chem. 1). The wet film was imidized by being calcined at 400° C. in a nitrogen atmosphere to form a 20 μm thick polyimide film as a resin substrate 30. In the manner described above, a stacked substrate 1 of Example 14 was fabricated.

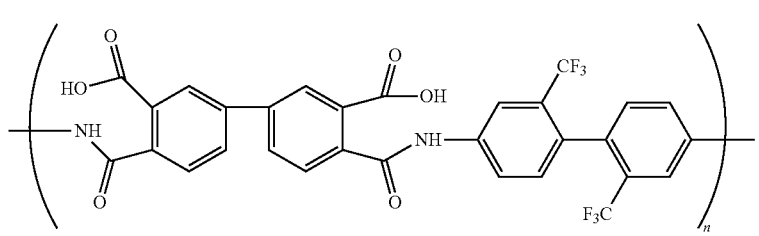

(Chem. 1)

Example 15

Polyimide substrate: 2 μm

A stacked substrate 1 of Example 1 was fabricated by the same procedures except that the thickness of the polyimide resin substrate 30 was changed to 2 μm, and thereafter a MoW thin film was formed in a thickness of 75 nm by a sputtering method. A stacked substrate 1 of Example 15 was thus fabricated.

Example 16

Transparent polyimide substrate

In Example 16, a stacked substrate 1 was fabricated in the same manner as in Example 1, except that the polyimide was changed to a transparent polyimide.

Comparative Example 1

No release layer

A glass substrate that was the same as the one used in Example 1 was provided as a support substrate 10. The support substrate 10 was spin coated with polyamide acid U-Varnish S (manufactured by UBE INDUSTRIES, LTD.). The wet film was imidized by being calcined at 400° C. in a nitrogen atmosphere to form a 20 μm thick polyimide film as a resin substrate 30. In the manner described above, a stacked substrate of Comparative Example 1 was fabricated.

Experimental Example 2

ITO: 4% $O_2$

In Experimental Example 2, a stacked substrate was fabricated in the same manner as in Example 9, except that the atmosphere during the sputtering of the release layer 20 was composed of 96% Ar and 4% $O_2$ (the ratio of oxygen gas: 4%).

Experimental Example 3

ITO: 10% $O_2$

In Experimental Example 3, a stacked substrate was fabricated in the same manner as in Example 9, except that the atmosphere during the sputtering of the release layer 20 was composed of 90% Ar and 10% $O_2$ (the ratio of oxygen gas: 10%).

Experimental Example 4

AIO: 8% $O_2$

In Experimental Example 4, a stacked substrate was fabricated in the same manner as in Example 7, except that the atmosphere during the sputtering of the release layer 20 was composed of 92% Ar and 8% $O_2$ (the ratio of oxygen gas: 8%).

Comparative Example 5

Polyimide substrate: 2 μm, no release layer

In Comparative Example 5, a stacked substrate was fabricated in the same manner as in Comparative Example 1, except that the thickness of the polyimide resin substrate 30 was changed to 2 μm, and thereafter a MoW thin film was formed in a thickness of 75 nm by a sputtering method. A stacked substrate of Comparative Example 5 was thus fabricated.

Comparative Example 6

Transparent polyimide substrate, no release layer

In Comparative Example 6, a stacked substrate was fabricated in the same manner as in Comparative Example 1, except that the polyimide was changed to a transparent polyimide.

[Evaluation of Amounts of Deformation of Resin Substrates During Laser Application]

The stacked substrates of Examples 1 to 9, Comparative Examples 1, and Experimental Examples 2 to 4 were each irradiated with laser light, and the amounts of deformation of the resin substrates 30 were measured. For the application of laser light, use was made of an excimer laser adapted to emit a flat-top beam having a beam size of 25 mm×1.8 mm. In the experiment, the laser light was applied in one shot while changing the energy density. To determine the amount of deformation displacement of the resin substrate 30, the height of the resin substrate 30 released from the support substrate 10 in the laser-irradiated regions was measured with a contact profiler.

Figure 6A:
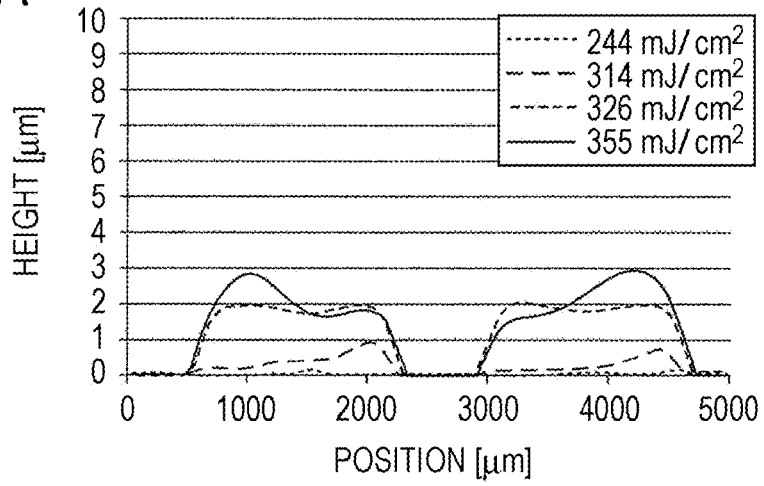
FIG. 6A is a diagram illustrating results of the measurement of the amount of deformation displacement of a resin substrate released from a support substrate in a stacked substrate of Example 1.
Figure 6B:
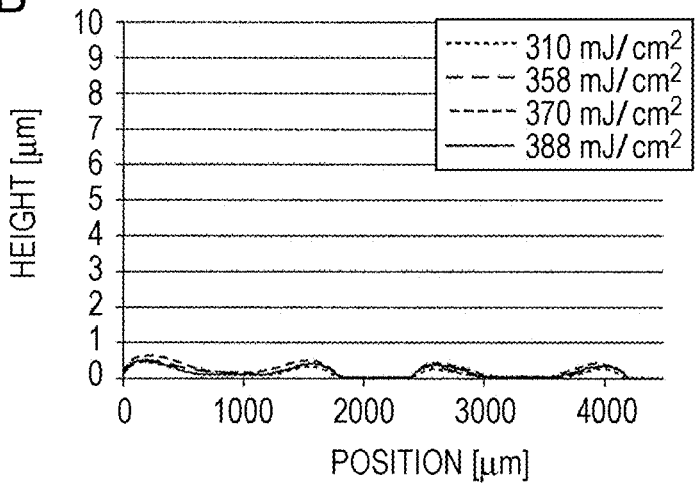
FIG. 6B is a diagram illustrating results of the measurement of the amount of deformation displacement of a resin substrate released from a support substrate in a stacked substrate of Example 2.
Figure 6C:
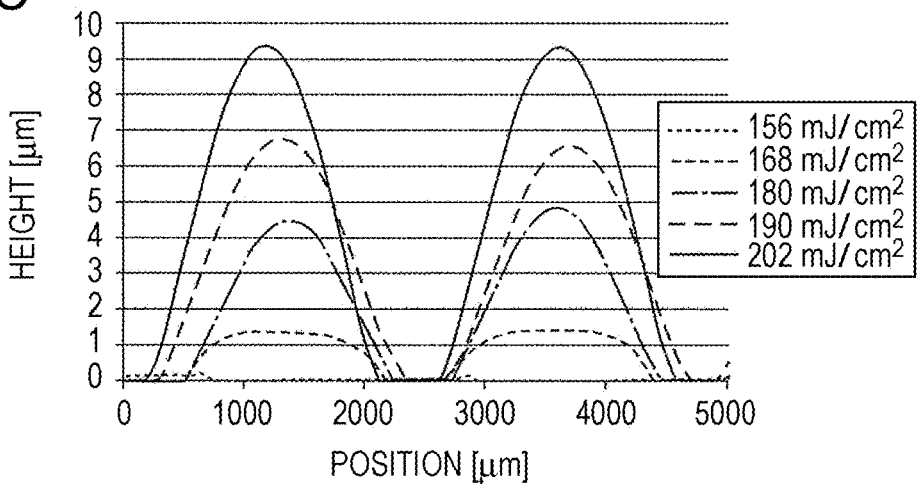
FIG. 6C is a diagram illustrating results of the measurement of the amount of deformation displacement of a resin substrate released from a support substrate in a stacked substrate of Comparative Example 1.

Of the measurement results obtained, the results of Example 1, Example 2 and Comparative Example 1 are shown in FIG. 6A, FIG. 6B and FIG. 6C, respectively.

As illustrated in FIG. 6A, the stacked substrate of Example 1 was not substantially delaminated and had no lifting of the resin substrate 30 when the energy density of the laser light was 244 mJ/cm². Meanwhile, at a laser light energy density of 314 mJ/cm², the resin substrate 30 was completely released, and the amount of deformation displacement of the resin substrate 30 was about 1 μm. The resin substrate 30 was completely detached also when the energy density of the laser light was 326 mJ/cm² and 355 mJ/cm², and the amounts of deformation displacement of the resin substrate 30 were about 2 µm and about 3 µm, respectively.

In the case of the stacked substrate of Example 2, as illustrated in FIG. 6B, the complete detachment of the resin substrate 30 was obtained over the entire range of the energy density of the laser light from 310 mJ/cm² to 388 mJ/cm², and the amounts of deformation displacement of the resin substrate 30 were about 0.5 µm.

In the case of the stacked substrate of Comparative Example 1, as illustrated in FIG. 6C, there was substantially no lifting of the resin substrate 30 and the resin substrate 30 was not released when the energy density of the laser light was 156 mJ/cm². At a laser light energy density of 168 mJ/cm², the resin substrate 30 was completely released but the amount of deformation displacement of the resin substrate 30 was about 1.3 µm. The amount of deformation displacement of the resin substrate 30 was increased as the energy density of the laser light was increased to 180 mJ/cm², 190 mJ/cm² and 202 mJ/cm². The maximum deformation displacement of the resin substrate 30 reached 9.2 µm when the energy density was 202 mJ/cm². At 202 mJ/cm², part of the resin substrate 30 (polyimide) was carbonized by the laser light and the generation of carbon dust was observed. Thus, studies at higher energy densities were cancelled.

Based on the above results, the following discussion can be made.

A certain amount of deformation of the resin substrate 30 is generated when releasing the resin substrate 30 from the support substrate 10. Based on the mechanical characteristics and the thicknesses of the polyimides used in the experiment, the amount of deformation displacement that will occur during the detachment is estimated to be about 0.5 to 1 µm.

In the case of stacked substrates without a release layer as illustrated in Comparative Example 1, the detachment of the resin substrate 30 probably occurs due to the decomposition of the polyimide by the application of laser light. Specifically, the polyimide is decomposed by the laser light to generate a decomposition gas, and the resin substrate 30 is deformed by the pressure of the gas. The amount of deformation displacement is increased with increasing amount of the decomposition gas generated and is in proportion to the energy density of the laser light. Thus, increasing the energy density of the laser light causes the amount of deformation displacement to be increased to above approximately 1 µm that is required for the resin substrate 30 to be released.

In Example 1 in which the stacked substrate included the release layer 20, the amount of deformation stayed at about 1 µm and the resin substrate 30 was completely released when the laser light energy density was 314 mJ/cm². (The amount of deformation stayed at as small as 2 to 3 µm even when the energy density of the laser light was increased.) In Example 2, the amount of deformation was about 0.5 µm over the entire range of the energy density of the laser light. It is understood that these deformations were not caused by the decomposition gas. As explained later, the transmittance of the support substrate 10 and the release layer 20 was low enough. Thus, at the interface between the release layer 20 and the resin substrate 30, the energy density of the laser light was lower than the processing threshold of the resin substrate 30 in Examples 1 and 2. Therefore, these results show that the polyimide in the resin substrate 30 was prevented from decomposition by the application of the laser light and thus generated no decomposition gas, and consequently the resin substrate 30 was successfully released from the support substrate 10 without being deformed by decomposition gas.

Next, the stacked substrates of Examples 1 to 9, Comparative Example 1 and Experimental Examples 2 to 4 will be discussed with reference to FIG. 7 which illustrates the amounts of deformation displacement (height) of the resin substrates 30 plotted versus the energy density of the laser light.

Figure 7:
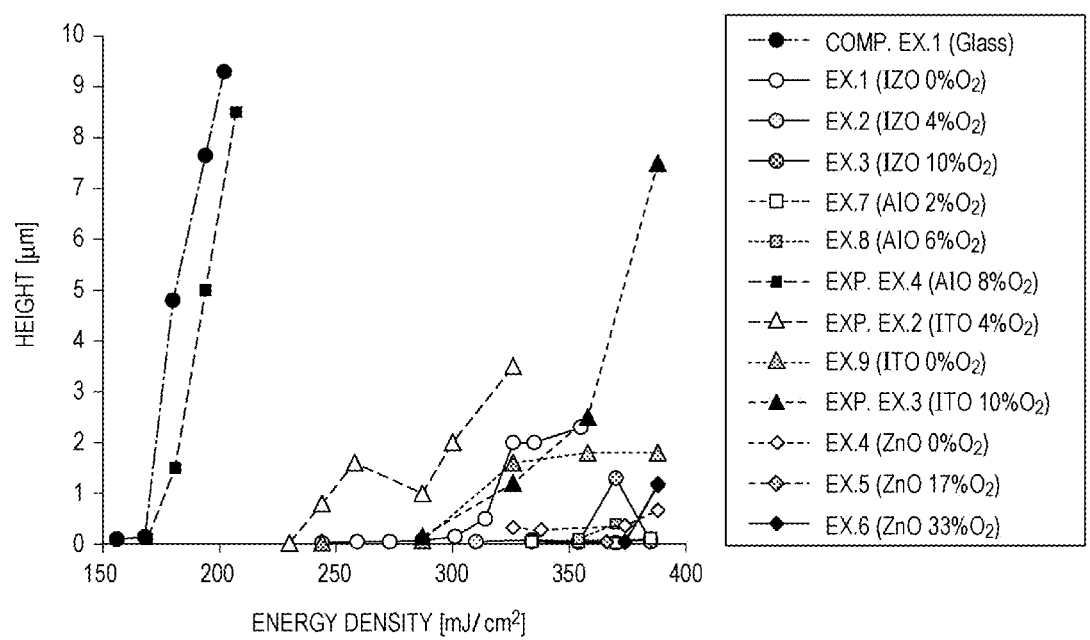
FIG. 7 is a diagram illustrating the amounts of deformation displacement of resin substrates in stacked substrates of Examples 1 to 9, Comparative Example 1, and Experimental Examples 2 to 4, plotted versus the energy density of laser light.

As illustrated in FIG. 7, the stacked substrates of Examples 1 to 9 exhibited larger amounts of displacement with increasing energy density of the laser light, but the maximum values of the displacement did not exceed 3 µm. The reasons for this result are because a major proportion of the laser light was absorbed by the release layer 20 during the travel in the release layer 20 and only a minor amount of the laser light reached the resin substrate 30. Accordingly, the resin substrate 30 (i.e. polyimide) is prevented from decomposition by the application of laser light, and no large deformation occurs in the absence of the generation of decomposition gas. As a result, the resin substrate 30 may be released while the deformation displacement is limited to a small but sufficient amount.

In contrast, the stacked substrates of Comparative Example 1 and Experimental Examples 2 to 4 exhibited as large amounts of displacement as about 3 µm to 9 µm as the energy density of the laser light was increased. This result shows that the laser light reached the resin substrate 30 (i.e. polyimide) and the resin substrate 30 was decomposed because the energy density of the laser light that reached the resin substrate 30 was above the threshold for the resin substrate 30 to be processed by the laser light.

From the above results, it is clear that controlling the energy density of laser light transmitted through the release layer 20 to below the processing threshold for the resin substrate 30 is highly important in order to prevent the deformation of the resin substrate 30.

[Evaluation of Transmittance of Release Layers]

To study the correlation between the transmittance and the amounts of deformation displacement of the resin substrates 30 obtained by the above experiment, the transmittance of the release layers 20 in the respective stacked substrates was measured at a certain wavelength of laser light. In this experiment, the materials of the release layers 20 used in Examples 1 to 9 and Experimental Examples 2 to 4 were stacked on quartz substrates, and their transmittances were measured with a UV visible light spectrometer. The results are described in FIG. 8. The substrate of Comparative Example 1 which did not have any release layer was subjected to the measurement as such.

Figure 8:
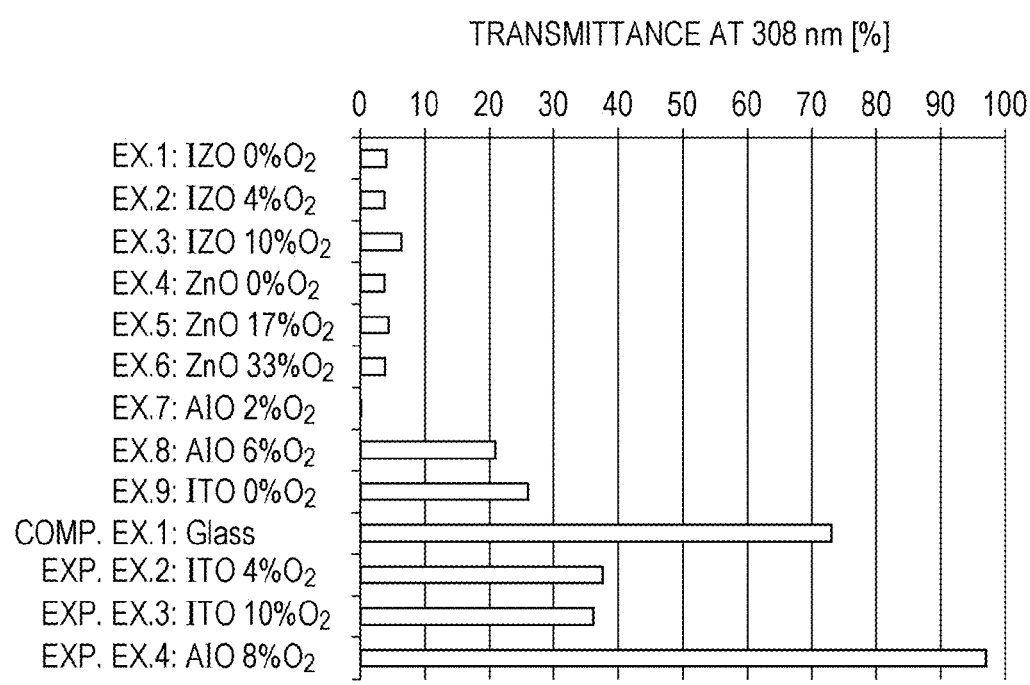
FIG. 8 is a diagram illustrating results of the measurement of the transmittance of release layers used in the stacked substrates of Examples 1 to 9 and Experimental Examples 2 to 4, and the transmittance of a glass substrate used in Comparative Example 1.

As illustrated in FIG. 8, the transmittance of the material of the release layer 20 was not more than 30% in all the stacked substrates of Examples 1 to 9 which had exhibited a relatively small deformation of the resin substrate 30 (polyimide) after the application of laser light. On the other hand, the transmittance of the material of the release layer 20 was above 30% in all the stacked substrates of Comparative Example 1 and Experimental Examples 2 to 4 which had exhibited a relatively large deformation of the resin substrate 30. Based on this, the transmittance of the release layer 20 is desirably not more than 30% in order to prevent the deformation of the resin substrate 30. Of course, the deformation can be reduced by adjusting the energy density of the laser light to be emitted so that the energy density of the laser light at the interface between the release layer 20 and the resin substrate 30 is lower than the threshold for the resin substrate 30 to be processed by the laser light.

Although details will not be described, the processing threshold of the polyimide material used in this experiment is known to be approximately 100 mJ/cm². Provided that the transmittance of the release layer 20 is not more than 30% and in consideration of the transmittance of the support substrate 10 (glass substrate), the energy density of the incident laser light should probably be 450 mJ/cm² or more in order for the energy density of the transmitted light to reach the processing threshold of the polyimide resin substrate 30. With the energy density of the incident laser light being 450 mJ/cm² or more, there is a risk that the support substrate 10 itself may be broken and also an expensive laser is required.

Based on the results discussed above, limiting the transmittance of the release layer 20 at the wavelength of the laser light to 30% or less ensures that the resin substrate 30 may be released from the support substrate 10 while avoiding damages to the support substrate 10 and preventing the deformation of the resin substrate 30.

[Effects of Thickness of Release Layers]

In order to study the effects of the thickness of the release layers 20, the amounts of deformation displacement (height) of the resin substrates 30 after the application of laser light were measured with respect to the stacked substrates of Examples 2, 10, 11, 12 and 13 having different thicknesses of the release layers 20. The results are shown in FIG. 9.

Figure 9:
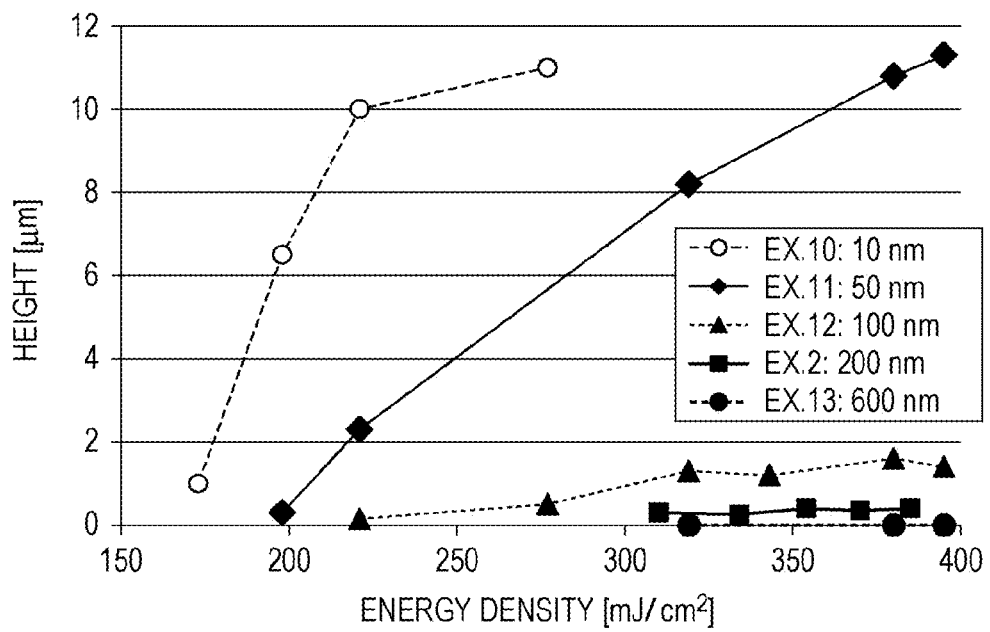
FIG. 9 is a diagram illustrating the amounts of deformation displacement of resin substrates in stacked substrates of Examples 2, 10, 11, 12 and 13, plotted versus the energy density of laser light.

As clear from FIG. 9, the resin substrates 30 (polyimide substrates) in the stacked substrates of Example 10 (release layer thickness: 10 nm) and Example 11 (release layer thickness: 50 nm) were deformed by a larger degree with increasing energy density of the laser light. The reasons for this are probably because the release layer 20 exhibited so high a transmittance that the laser light transmitted through the release layer 20 decomposed the resin substrate 30 (i.e. polyimide), and the resin substrate 30 was deformed by the pressure of the decomposition gas.

On the other hand, the amount of deformation displacement of the resin substrate 30 was below 2 µm in the stacked substrate of Example 12 (release layer thickness: 100 nm). Thus, the release layer 20 was shown to have the same effect as that in the stacked substrate of Example 2.

In the stacked substrate of Example 13 (release layer thickness: 600 nm), the resin substrate 30 had no displacement and there was no detachment of the resin substrate 30. The reasons for this are probably because the thickness of the release layer 20 was so large that the denaturation of the release layer 20 by the application of the laser light did not reach the interface between the resin substrate 30 (i.e. polyimide) and the release layer 20.

Figure 10:
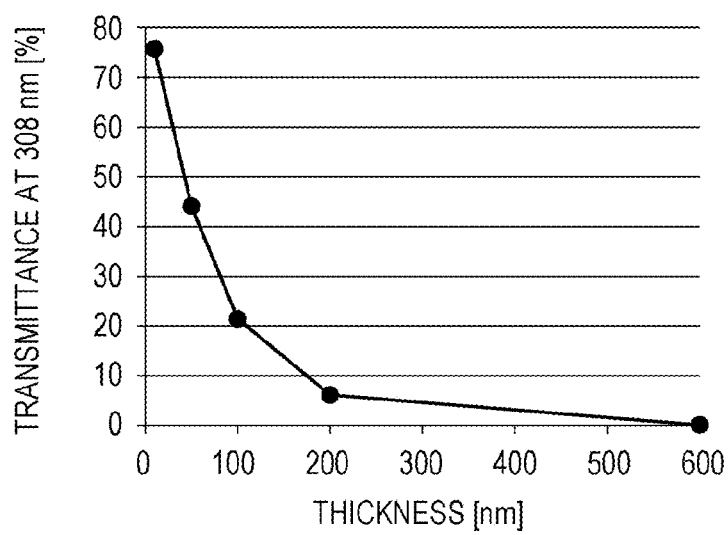
FIG. 10 is a diagram illustrating a relationship between the transmittance and the thickness of release layers used in the stacked substrates of Examples 2, 10, 11, 12 and 13.

To examine the correlation between the amounts of deformation displacement of the resin substrates 30 obtained above and the transmittance of the release layers 20, the transmittance of the release layers 20 in the stacked substrates of Examples 2, 10, 11, 12 and 13 was measured at a certain wavelength of the laser light. The results are shown in FIG. 10. In this experiment, the materials of the release layers 20 used in Examples 2, 10, 11, 12 and 13 were stacked on quartz substrates, and their transmittances were measured with a UV visible light spectrometer at 308 nm as the wavelength of the laser light.

As shown in FIG. 10, the thicknesses of the release layers 20 of 10 nm and 50 nm corresponded to high transmittances of 76% and 44%, respectively. It was thus confirmed that the energy density of the laser light transmitted through the release layer 20 had easily reached the threshold for the resin substrate 30 (polyimide) to be processed, and consequently a deformation had occurred in the resin substrate 30. Of course, such a deformation can be avoided by adjusting the energy density of the laser light to be emitted so that the energy density of the laser light at the interface between the release layer 20 and the resin substrate 30 is lower than the threshold for the resin substrate 30 to be processed by the laser light.

[Relationships between Oxygen Deficiency of Metal Oxide and Detachment]

Figure 11A:
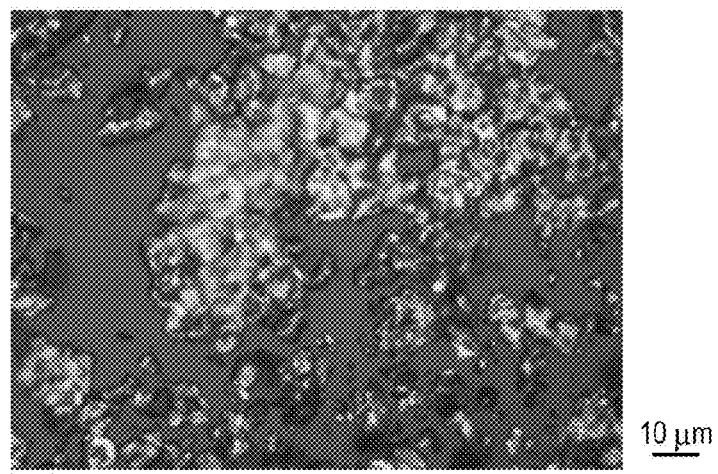
FIG. 11A is an optical micrograph illustrating the surface of the release layer in the stacked substrate of Example 1 after the release of the resin substrate.
Figure 11B:
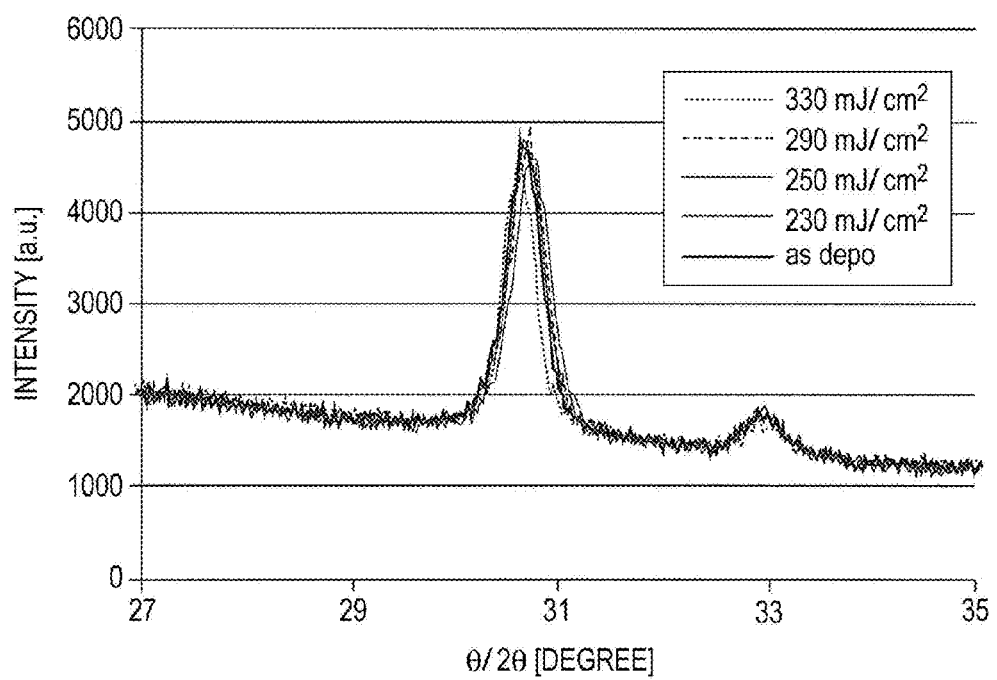
FIG. 11B is a diagram illustrating results of XRD measurement with respect to the surface of the release layer in the stacked substrate of Example 1 after the release of the resin substrate.
Figure 12A:
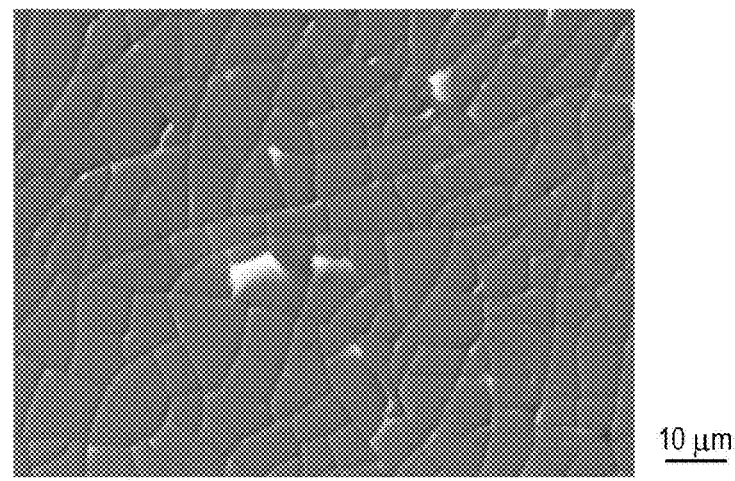
FIG. 12A is an optical micrograph illustrating the surface of the release layer in the stacked substrate of Example 3 after the release of the resin substrate.
Figure 12B:
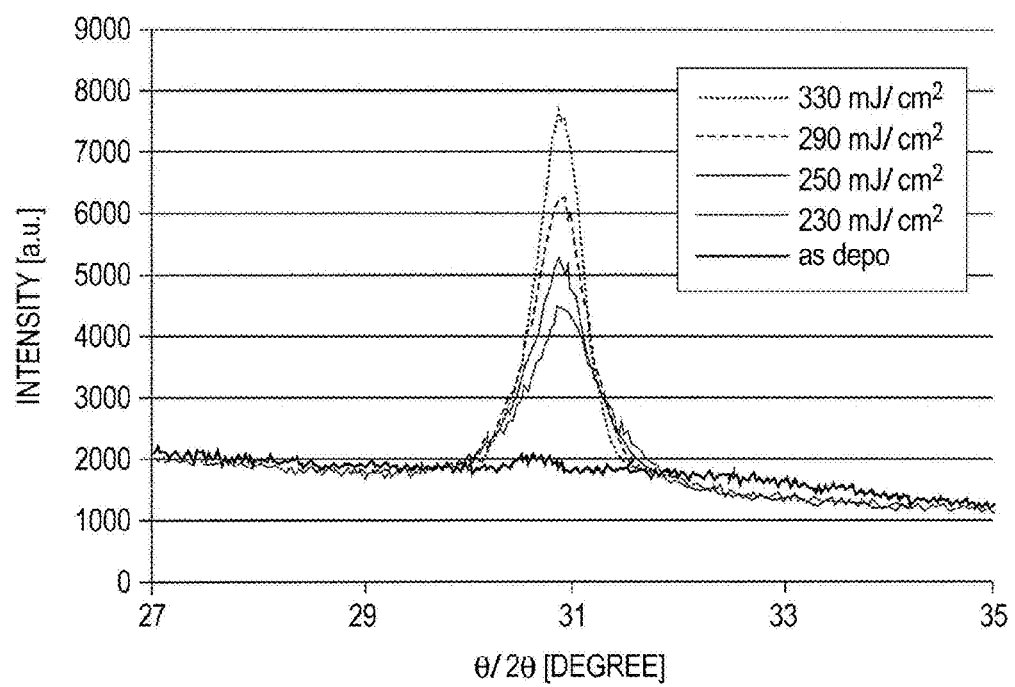
FIG. 12B is a diagram illustrating results of XRD measurement with respect to the surface of the release layer in the stacked substrate of Example 3 after the release of the resin substrate.

Next, there will be described mechanisms by which the modes of detachment are changed by the presence or absence of oxygen deficiency in the release layer 20 formed of a metal oxide. In this experiment, the mechanisms of the detachment were estimated by analyzing the surface conditions of the release layers 20 after the resin substrates 30 (i.e. polyimide substrates) were released by the application of laser light to the stacked substrates of Example 1 and Example 3. The results of the analysis are shown in FIGS. 11A, 11B, 12A and 12B. FIGS. 11A and 11B illustrate the results of the analysis of the stacked substrate of Example 1, and FIGS. 12A and 12B illustrate the results of the analysis of the stacked substrate of Example 3. FIGS. 11A and 12A are optical micrographs illustrating the surfaces of the release layers 20. FIGS. 11B and 12B show the results of X-ray diffraction (XRD) analysis.

The release layer 20 in Example 1 was formed of oxygen-deficient indium zinc oxide. In this case, as illustrated in FIGS. 11A and 11B, the release layer 20 was not crystallized by the application of laser light and the crystallinity of the layer remained the same. That is, the detachment of the resin substrate 30 in this case presumably occurred as a result of the breakage of the release layer 20 itself.

On the other hand, the release layer 20 in Example 3 was formed of indium zinc oxide without oxygen deficiency. In this case, as clearly illustrated in FIGS. 12A and 12B, the application of laser light promoted the crystallization of the release layer 20. Thus, the detachment of the resin substrate 30 is presumably ascribed to the swelling of the surface of crystal grains forming the release layer 20.

Further, FIG. 11B shows that the release layer 20 including oxygen-deficient indium zinc oxide (Example 1) had already been crystallized as early as during the process of forming the resin substrate 30 ("as depo" in the figure). That is, the release layer 20 had been crystallized before the application of laser light.

From FIG. 12B, on the other hand, the release layer 20 including indium zinc oxide without oxygen deficiency (Example 3) was not crystallized during the process of forming the resin substrate 30 and was crystallized when the laser light was applied.

These results suggest that the stacked substrate having the release layer 20 with a low oxygen compositional ratio (e.g. Example 1) starts to be crystallized at a lower temperature than the stacked substrate having the release layer 20 with a high oxygen compositional ratio (e.g. Example 3).

Further, as illustrated in FIG. 7, the minimum laser intensity that induced detachment (=detachment threshold) was about 290 mJ/cm² in the stacked substrate of Example 1 while that in the stacked substrate of Example 3 was about 360 mJ/cm².

These results show that the release layer 20 including oxygen-deficient indium zinc oxide (Example 1) allows the resin substrate 30 to be detached with a lower energy density than is required with the release layer 20 including indium zinc oxide without oxygen deficiency (Example 3).

Because the release layer 20 including oxygen-deficient indium zinc oxide presumably has a relatively low crystallization onset temperature as described above, it is assumed that the release layer 20 will show a significant state change in response to heat and will be collapsed by the application of laser light having a low energy density. The similar relationship between the oxygen compositional ratio and the detachment threshold tends to be observed in other metal oxides, and the detachment threshold becomes lower with decreasing oxygen compositional ratio. That is, the resin substrate 30 may be released more easily by forming the release layer 20 using a metal oxide having a lower oxygen compositional ratio.

[Relationships between Fluorine-Containing Polyimide and Detachment]

Next, the effects of the fluorine element in decreasing the detachment threshold and the estimated mechanisms of detachment will be described with respect to the stacked substrate of Example 14 that used the fluorine-containing resin substrate 30.

The irradiation of the stacked substrate of Example 14 with laser light showed that the detachment threshold was about 210 mJ/cm$^2$. On the other hand, the stacked substrate of Example 1 in which the release layer 20 included the same material as in Example 14 had a detachment threshold of 290 mJ/cm$^2$. These results clearly show that the detachment threshold is significantly decreased when the resin substrate 30 contains the fluorine element as in the stacked substrate of Example 14, as compared to when the resin substrate 30 is free from the fluorine element as in Example 1.

Regarding the difference in detachment threshold, the present inventor focused attention on the molecular structure of the resin substrate 30 (i.e. polyimide) and the bonding interface between the resin substrate 30 and the release layer 20, and conducted analysis by X-ray photoelectron spectroscopy (XPS). The results are illustrated in FIGS. 13A to 13D.

Figure 13A:
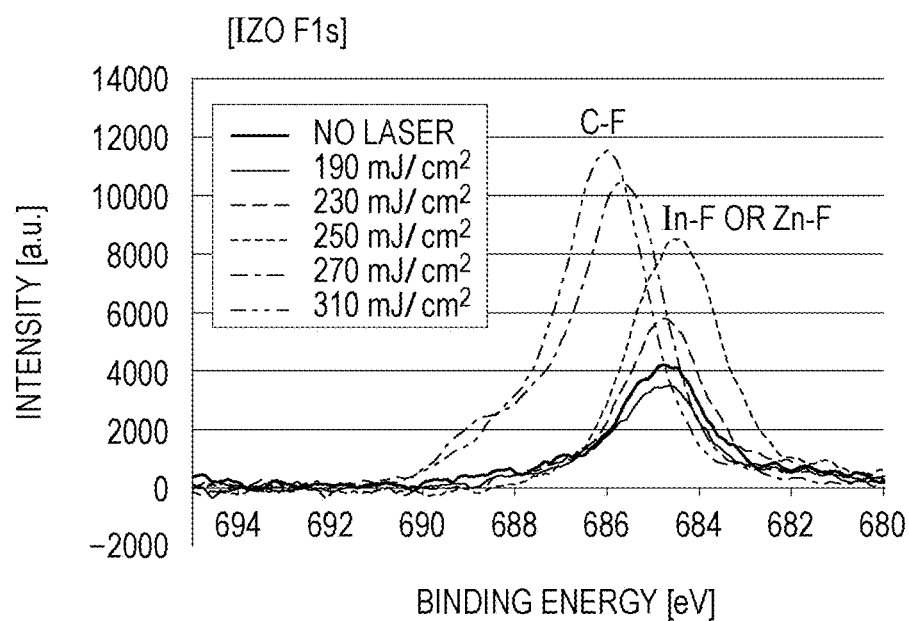
FIG. 13A is a diagram illustrating an F1s XPS spectrum measured with respect to the surface of a release layer in a stacked substrate of Example 14 after the release of a resin substrate.
Figure 13B:
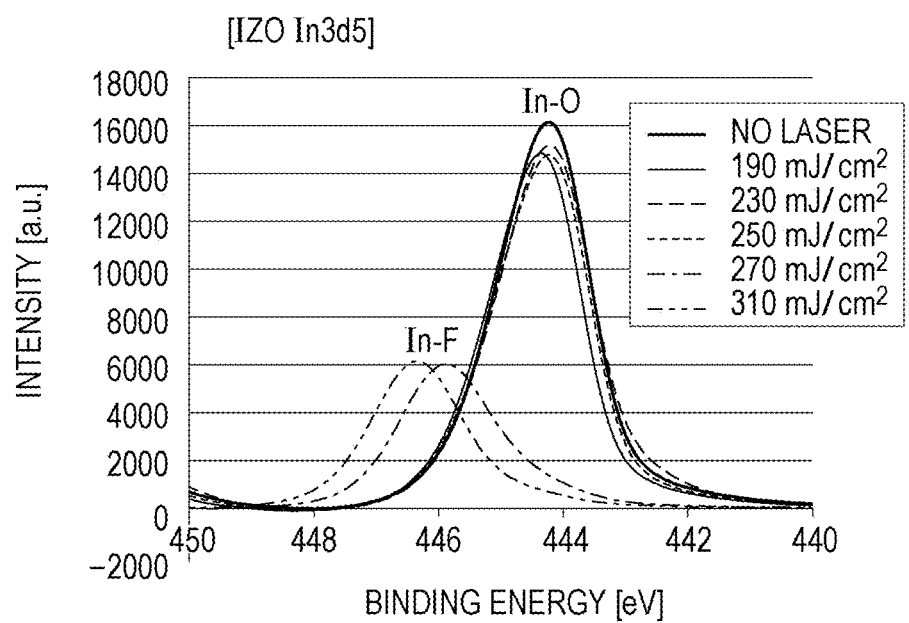
FIG. 13B is a diagram illustrating an In3d5 XPS spectrum measured with respect to the surface of the release layer in the stacked substrate of Example 14 after the release of the resin substrate.

FIGS. 13A and 13B illustrate XPS spectra of the surface of the release layer 20 (the surface on the side on which the resin substrate 30 was disposed) measured after the stacked substrate of Example 14 was delaminated by the application of laser light or by a mechanical force without the application of laser light ("no laser" in the figure). FIG. 13A is an F1s narrow scan spectrum, and FIG. 13B is an In3d5 narrow scan spectrum. Specifically, FIGS. 13A and 13B illustrate results of analysis of the interface between the release layer 20 and the resin substrate 30 as studied with respect to the release layer 20 side.

Figure 13C:
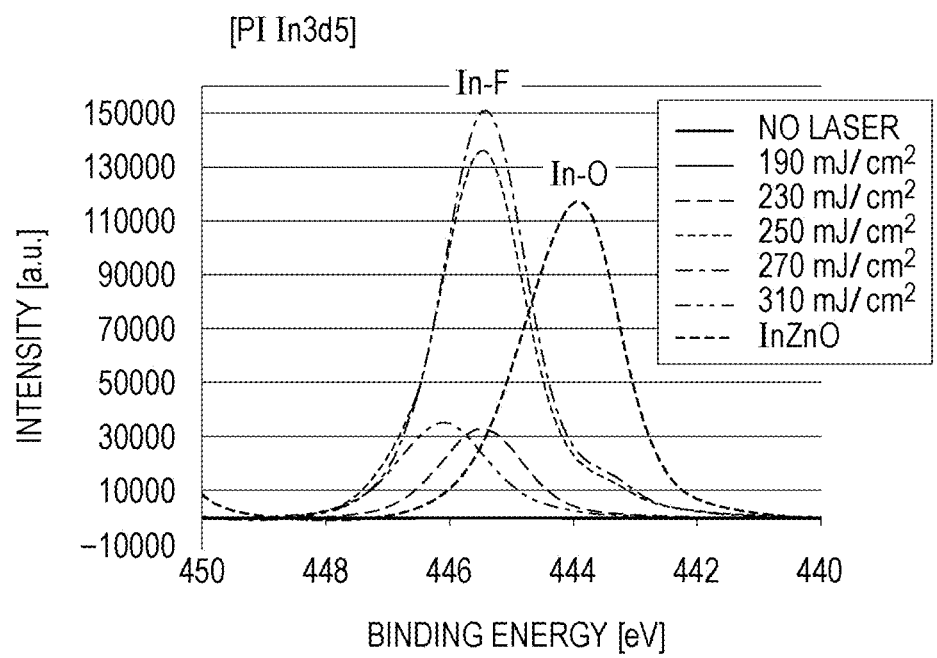
FIG. 13C is a diagram illustrating an In3d5 XPS spectrum measured with respect to the surface of the resin substrate adjacent to the release layer in the stacked substrate of Example 14 after the release of the resin substrate.
Figure 13D:
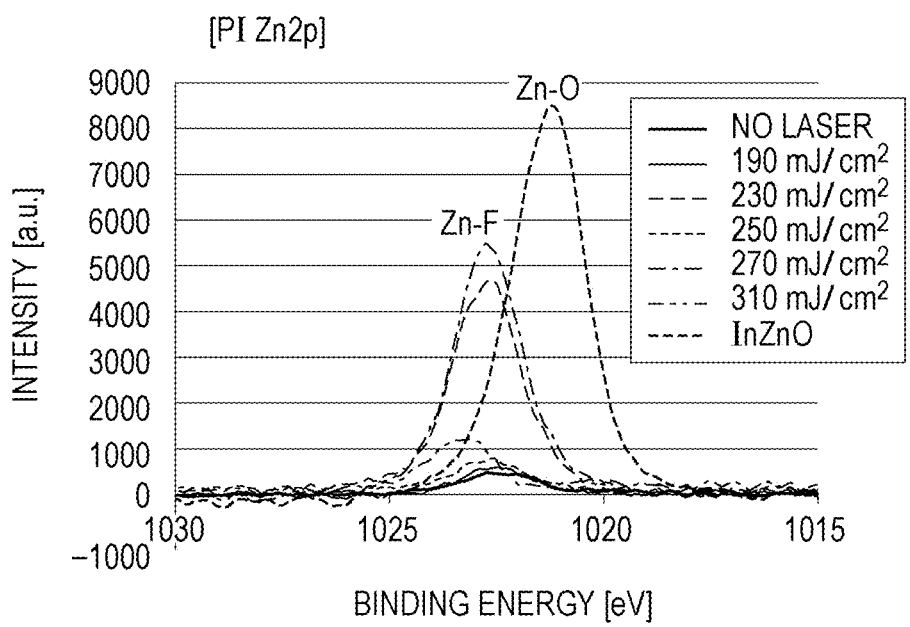
FIG. 13D is a diagram illustrating a Zn2p XPS spectrum measured with respect to the surface of the resin substrate adjacent to the release layer in the stacked substrate of Example 14 after the release of the resin substrate.

FIGS. 13C and 13D illustrate XPS spectra of the surface of the resin substrate 30 (the surface on the side on which the release layer 20 was disposed) measured after the stacked substrate of Example 14 was delaminated by the application of laser light or by a mechanical force without the application of laser light ("no laser" in the figure). FIG. 13C is an In3d5 narrow scan spectrum, and FIG. 13D is a Zn2p narrow scan spectrum. Specifically, FIGS. 13C and 13D illustrate results of analysis of the interface between the release layer 20 and the resin substrate 30 as studied with respect to the resin substrate 30 side.

As illustrated in FIG. 13A, the surface of the release layer 20 (i.e. IZO film) exposed by delamination by a mechanical force without the application of laser light ("no laser") showed a peak assigned to In—F bonds or Zn—F bonds. The reasons for the appearance of this peak are probably because a reaction occurred at the interface between the polyimide and IZO and the fluorine atoms released from the polyimide were captured onto the In or Zn atoms during the step of forming the resin substrate 30 (i.e. polyimide) on the release layer 20 (i.e. IZO film).

Further, as respectively illustrated in FIGS. 13C and 13D, a peak assigned to In—F bonds or Zn—F bonds was observed also in the analysis of the surface of the resin substrate 30 exposed by delamination by a mechanical force without the application of laser light ("no laser").

These results are another evidence suggesting the formation of InZnFO at the interface between the resin substrate 30 (i.e. polyimide) and the release layer 20 (IZO).

Further, as illustrated in FIG. 13B, the proportion of In—F bonds on the surface of the release layer 20 (i.e. IZO film) increased with increasing energy density (illumination intensity) of the laser light, and a substantial proportion of the bonds were In—F bonds at 270 mJ/cm$^2$.

Similarly, as illustrated in FIGS. 13C and 13D, the proportion of In—F bonds and Zn—F bonds on the surface of the resin substrate 30 (i.e. polyimide substrate) increased with increasing energy density of the laser light, and a substantial proportion of the bonds were In—F bonds and Zn—F bonds at 270 mJ/cm$^2$.

These results suggest that after irradiated with laser light at an energy density of 270 mJ/cm$^2$, the surface of the release layer 20 was substantially InZnF and the InZnF was also attached to the surface of the resin substrate 30 adjacent to the release layer 20. Based on this, it is assumed that the detachment of the resin substrate 30 occurred at the interface between InZnF and the resin substrate 30 or within the InZnF film.

As illustrated in FIGS. 13C and 13D, the peaks of In and Zn showed another decrease in intensity when the energy density of the laser light was 310 mJ/cm$^2$. This shows that there was no attachment of In or Zn at the surface of the resin substrate 30 adjacent to the release layer 20. In this case, although not illustrated in the figures, the detachment mode was the collapse of the surface of the release layer 20. Thus, the detachment of the resin substrate 30 is assumed to be due to the collapse of InZnF.

Based on the results discussed above, it is probable that InZnF formed at the interface between the resin substrate 30 and the release layer 20 plays an important role in the phenomenon in which a detachment occurs between the resin substrate 30 and the release layer 20. That is, the interfacial reaction between the fluorine-containing resin substrate 30 and the metal-containing release layer 20 to form a metal fluoride (a metal fluoride layer) is induced by a lower energy density of laser light than the energy density that causes melting or crystallization of the release layer 20 itself. Thus, it becomes possible to release the resin substrate 30 from the support substrate 10 easily with laser light having a low energy density by using a resin substrate 30 containing the fluorine element and a release layer 20 including a metal or a metal oxide.

Although not illustrated in the figures, it has been confirmed that the combined use of the release layer 20 in any of Examples 2 to 9 with the fluorine-containing resin substrate 30 similarly results in the formation of a metal fluoride (a metal fluoride layer) and provides the similar effect in reducing the detachment threshold.

[Effects on Thickness of Resin Substrates]

Next, there will be described the effects of allowing smaller thicknesses of the resin substrates by using the release layers 20 of Examples.

The thickness of the resin substrate 30 (e.g. polyimide substrate) needs to be about 20 µm or more when the detachment is made by methods other than the method of the present embodiment. If the thickness of the resin substrate 30 is less than 20 µm, in particular 3 µm or less, the resin substrate 30 is so poor in mechanical strength and is so readily stretched that the application of a mechanical force for the detachment without using laser light inevitably causes a damage to a functional element by the stretching of the resin substrate 30. Even when the detachment is made by using laser light, such a resin substrate 30 is significantly deformed by the pressure of a decomposition gas and the large displacement results in a damage to the functional element.

On the other hand, the thickness of the resin substrates 30 is a very important factor that determines the bendability of flexible electronic devices. Small thickness of the resin substrates 30 is an essential requirement in the production of highly flexible electronic devices or stretchable electronic devices.

To confirm the effects of the release layer 20 of the present embodiment on the thin resin substrate 30, the stacked substrates of Example 15 and Comparative Example 5 were irradiated with laser light to detach the resin substrates 30, and the sheet resistance of the MoW thin films was measured. The results are described in FIG. 14. The energy density of the laser light was the minimum required for the detachment of the resin substrate 30.

As described in FIG. 14, the sheet released from the stacked substrate of Comparative Example 5 having no release layer exhibited an increased sheet resistance as compared to before the detachment. The reasons for this increase in sheet resistance are probably because, although the energy density of the laser light was the detachment threshold, the resin substrate 30 was deformed with a great displacement due to its small thickness and consequently the MoW thin film was damaged.

On the other hand, the sheet released from the stacked substrate of Example 15 which had the release layer 20 did not show an increase in sheet resistance. The reasons for this are probably because the resin substrate 30 was successfully detached while the substantial proportion of the laser light was not allowed to be transmitted through the release layer 20 and consequently the amount of deformation displacement of the resin substrate 30 was reduced to the minimum.

Based on the above results, the use of the release layer 20 as illustrated in Examples makes it possible to release the resin substrate 30 from the support substrate 10 without causing a damage to the functional element 40 even in the case where the thickness of the resin substrate 30 is 3 μm or less.

[Effects on Transparent Polyimide Resin Substrates]

Next, there will be described the effects obtained in the detachment of transparent polyimide resin substrates by using the release layers 20 of Examples.

Transparent polyimides having a high transmittance to visible light wavelengths generally have a higher transmittance to UV wavelengths than usual yellow polyimides. Thus, their transmittance with respect to laser lights used for detachment is high. This fact causes problems in a stacked substrate in which a transparent polyimide resin substrate is stacked on a support substrate. Specifically, detaching the resin substrate is difficult because of the small absorption of laser light by the resin substrate, and a functional element disposed on the resin substrate is damaged by the laser light transmitted through the resin substrate.

On the other hand, high transmittance of resin substrates is a requirement in the production of bottom-emission devices or displays, or see-through transparent electronic devices or displays. It is therefore desirable to use transparent polyimides as the materials for the resin substrates.

To confirm the effects of the release layer 20 in the stacked substrate of the present embodiment which has a transparent polyimide resin substrate 30, the stacked substrates of Example 16 and Comparative Example 6 were irradiated with laser light and the releasability of the resin substrates 30 was evaluated. The results are described in FIG. 15. The energy density of the laser light was the minimum required for the detachment of the resin substrate 30.

As described in FIG. 15, the resin substrate 30 in the stacked substrate of Example 16 which had the release layer 20 was successfully released from the support substrate 10, while the resin substrate 30 in the stacked substrate of Comparative Example 6 without any release layer could not be released from the support substrate 10 and the laser light was observed to be transmitted through the resin substrate 30.

These results show that the laser light was prevented from reaching the resin substrate 30 (i.e. transparent polyimide resin substrate) by the use of the release layer 20. That is, it has been shown that the transmittance of the resin substrate 30 does not affect the releasability of the resin substrate 30.

From the foregoing, the use of the release layer 20 as illustrated in this Example makes it possible to release the resin substrate 30 from the support substrate 10 easily even in the case where the resin substrate 30 is made of a transparent polyimide resin.

(Additional statements)

While the electronic device manufacturing methods, the flexible substrate manufacturing methods, the stacked substrates and the electronic devices according to the present disclosure have been illustrated hereinabove based on some embodiments and examples, the scope of the present disclosure is not limited to those embodiments and examples.

For example, the scope of the present disclosure includes various modifications to the embodiments and to the modified embodiments that occur to those skilled in the art, and any combinations of the constituent elements and the functions described in the embodiments and the modified embodiments without departing from the spirit of the present disclosure.

What is claimed is:

1. A method for manufacturing an electronic device comprising a resin substrate and an electronic component, the method including:
    providing a support substrate having a first surface and a second surface opposite to the first surface;
    forming a release layer on the first surface of the support substrate, the release layer including a metal or a metal oxide;
    forming the resin substrate on the release layer;
    forming the electronic component on the resin substrate; and
    separating the resin substrate from the support substrate by applying laser light to the support substrate through the second surface, wherein
    the laser light does not reach an first interface between the resin substrate and the release layer, or
    the laser light is transmitted through the support substrate and the release layer to reach the first interface, and at the first interface, the laser light has an energy density lower than a threshold for the resin substrate to be processed by the laser light.

2. The method according to claim 1, wherein the electronic component is a light emitting device that emits light.

3. The method according to claim 1, wherein the electronic component is a thin film transistor or a sensor.

4. The method according to claim 1, wherein
    a transmittance of the release layer at a wavelength of the laser light is 30% or less.

5. The method according to claim 1, wherein
    the release layer includes the metal, and
    the metal includes at least one selected from the group consisting of zinc, indium, molybdenum and tungsten.

6. The method according to claim 1, wherein
the release layer includes the metal oxide, and
the metal oxide includes at least one selected from the group consisting of zinc oxide, indium zinc oxide, indium tin oxide, aluminum oxide, molybdenum oxide and tungsten oxide.

7. The method according to claim 6, wherein
the metal oxide is an oxygen-deficient metal oxide.

8. The method according to claim 1, wherein
a wavelength of the laser light is not less than 250 nm and not more than 11000 nm.

9. The method according to claim 1, wherein
the resin substrate contains fluorine element.

10. The method according to claim 9, wherein
a substance having a metal-fluorine bond is formed at the first interface between the resin substrate and the release layer by the application of the laser light to the support substrate through the second surface of the support substrate.

11. The method according to claim 1, wherein
the resin substrate comprises a transparent resin.

12. The method according to claim 1, wherein
a thickness of the release layer is not more than 1000 nm.

13. The method according to claim 1, wherein
a thickness of the resin substrate is not less than 0.1 µm and not more than 100 µm.

14. A method for manufacturing an electronic device comprising a resin substrate and an electronic component, the method including:
providing a support substrate having a first surface and a second surface opposite to the first surface;
forming a release layer on a first surface of the support substrate, the release layer including a metal oxide including at least one selected from the group consisting of zinc oxide, indium zinc oxide, indium tin oxide, aluminum oxide, molybdenum oxide and tungsten oxide;
forming the resin substrate on the release layer, the resin substrate containing fluorine element;
forming the electronic component on the resin substrate; and
separating the resin substrate from the support substrate by applying laser light to the support substrate through the second surface of the support substrate.

15. The method according to claim 14, wherein the electronic component is a light emitting device that emits light.

16. The method according to claim 14, wherein the electronic component is a thin film transistor or a sensor.

17. A method for manufacturing a flexible substrate comprising a resin substrate, the method including:
providing a support substrate having a first surface and a second surface opposite to the first surface;
forming a release layer including a metal or a metal oxide on the first surface of the support substrate;
forming the resin substrate on the release layer; and
separating the resin substrate from the support substrate by applying laser light to the support substrate through the second surface of the support substrate, wherein
the laser light does not reach an first interface between the resin substrate and the release layer, or
the laser light is transmitted through the support substrate and the release layer to reach the first interface, and at the first interface, the laser light has an energy density lower than a threshold for the resin substrate to be processed by the laser light.

\* \* \* \* \*